(12) United States Patent
Yonemaru

(10) Patent No.: US 10,294,984 B2
(45) Date of Patent: May 21, 2019

(54) HINGE UNIT AND METHOD FOR LIMITING ROTATION ANGLE OF HINGE UNIT

(71) Applicant: NEC Platforms, Ltd., Kawasaki-shi, Kanagawa (JP)

(72) Inventor: Shinichirou Yonemaru, Kanagawa (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/565,470

(22) PCT Filed: Feb. 3, 2016

(86) PCT No.: PCT/JP2016/000554
§ 371 (c)(1),
(2) Date: Oct. 10, 2017

(87) PCT Pub. No.: WO2016/170715
PCT Pub. Date: Oct. 27, 2016

(65) Prior Publication Data
US 2018/0128309 A1    May 10, 2018

(30) Foreign Application Priority Data

Apr. 20, 2015  (JP) .................... 2015-085795

(51) Int. Cl.
*F16C 11/10*   (2006.01)
*F16C 11/04*   (2006.01)
(Continued)

(52) U.S. Cl.
CPC .......... *F16C 11/10* (2013.01); *B60R 11/0229* (2013.01); *F16C 11/04* (2013.01);
(Continued)

(58) Field of Classification Search
CPC ...... F16C 11/10; F16C 11/04; B60R 11/0229; H05K 5/03; H04N 5/64; F16M 11/10
(Continued)

(56) References Cited

U.S. PATENT DOCUMENTS 6,666,422 B1 * 12/2003 Lu .................. G06F 1/1616
                                                    16/340
7,444,716 B2 * 11/2008 Hsu ................. F16M 11/10
                                                    16/337
(Continued)

FOREIGN PATENT DOCUMENTS

JP    07-040957 U    7/1995
JP    2002-106542 A  4/2002
(Continued)

OTHER PUBLICATIONS

International Search Report for PCT/JP2016/000554 dated Apr. 19, 2016 [PCT/ISA/210].
(Continued)

*Primary Examiner* — Muhammad Ijaz
(74) *Attorney, Agent, or Firm* — Sughrue Mion, PLLC

(57) ABSTRACT

A hinge unit includes a first member, a second member, a coupling member, a protrusion fixed to the first member, and a tilt stopper. When the tilt stopper is fixed at a position (P1) of the second member, the tilt stopper and the protrusion are brought into contact with each other, to thereby limit a movable range within a first angle range. When the tilt stopper is fixed at a position (P2) of the second member, the tilt stopper and the protrusion are held in non-contact with each other irrespective of a pivoting angle.

9 Claims, 29 Drawing Sheets

(51) Int. Cl.
   *H05K 5/03* (2006.01)
   *B60R 11/02* (2006.01)
   *H04N 5/64* (2006.01)
   *F16M 11/10* (2006.01)

(52) U.S. Cl.
   CPC .............. *H05K 5/03* (2013.01); *F16M 11/10* (2013.01); *H04N 5/64* (2013.01)

(58) Field of Classification Search
   USPC .... 248/917, 923, 922, 919, 291.1, 466, 470, 248/351, 688, 188, 188.91, 188.8; 403/84, 92, 93, 96, 98, 103, 104
   See application file for complete search history.

(56) References Cited

U.S. PATENT DOCUMENTS

| | | | | |
|---|---|---|---|---|
| 7,530,541 B2* | 5/2009 | Wang | .............. | F16M 11/10 16/343 |
| 7,597,302 B2* | 10/2009 | Lee | .............. | F16M 11/08 248/157 |
| 7,644,473 B2* | 1/2010 | Chen | .............. | G06F 1/1601 16/330 |
| 7,690,605 B2* | 4/2010 | Lee | .............. | F16M 11/10 248/133 |
| 7,731,137 B2* | 6/2010 | Lee | .............. | F16M 11/10 248/157 |
| 7,753,331 B2* | 7/2010 | Tang | .............. | F16M 11/10 16/339 |
| 7,967,260 B2* | 6/2011 | Hsu | .............. | F16M 11/10 248/133 |
| 8,196,875 B2* | 6/2012 | Lien | .............. | F16M 11/10 248/121 |
| 8,967,569 B2* | 3/2015 | Hsu | .............. | F16M 11/10 16/233 |
| 2003/0122046 A1* | 7/2003 | Huong | .............. | E05D 11/087 248/291.1 |
| 2008/0141493 A1* | 6/2008 | Hsu | .............. | F16M 11/10 16/337 |
| 2009/0320240 A1* | 12/2009 | Wang | .............. | G06F 1/1616 16/231 |
| 2012/0273449 A1* | 11/2012 | Hsu | .............. | F16M 11/10 211/195 |
| 2014/0252181 A1* | 9/2014 | Mau | .............. | E05D 3/12 248/125.1 |

FOREIGN PATENT DOCUMENTS

| | | |
|---|---|---|
| JP | 2004-169901 A | 6/2004 |
| JP | 2008-240927 A | 10/2008 |
| JP | 2010-108189 A | 5/2010 |
| JP | 2011-133557 A | 7/2011 |

OTHER PUBLICATIONS

Written Opinion for PCT/JP2016/000554 dated Apr. 19, 2016 [PCT/ISA/237].

Japanese Office Action for JP 2015-085795 dated Jul. 27, 2016.

* cited by examiner

HINGE UNIT AND METHOD FOR LIMITING ROTATION ANGLE OF HINGE UNIT

CROSS REFERENCE TO RELATED APPLICATIONS

This application is a National Stage of International Application No. PCT/JP2016/000554 filed Feb. 3, 2016, claiming priority based on Japanese Patent Application No. 2015-085795 filed Apr. 20, 2015, the contents of all of which are incorporated herein by reference in their entirety.

TECHNICAL FIELD

This invention relates to a hinge mechanism, and more particularly, to limitation of a pivotable angle range of the hinge mechanism.

BACKGROUND ART

In general, a display apparatus includes a tilt hinge mechanism capable of changing a tilt angle of the display apparatus in order to allow adjustment of an inclination of a screen in accordance with a user's line of sight. The display apparatus described herein may be a simple display apparatus that only performs output of an image or may be, for example, a display-integrated information processing apparatus that integrally includes a liquid crystal display (LCD) and a computer, more specifically, a POS terminal apparatus.

In the display apparatus of this type, it is sometimes preferred that an upper limit and a lower limit of a tiltable angle differ depending on use conditions. In the following description, an angle range of from the upper limit to the lower limit of the tiltable angle of a tilt hinge mechanism is referred to as a movable range of the tilt hinge mechanism. For example, a preferable movable range of the POS terminal apparatus differs between a case where an operator or the like performs register operations, and a case where a service engineer or the like performs maintenance work on the POS terminal apparatus. In the former case, an operator performs operations in a standing posture at a register while looking down the POS terminal apparatus. Accordingly, assuming that the tilt angle is 0 degrees when the screen of the display is perpendicular to a horizontal plane, a sufficient upper limit of the tilt angle at the time of performing the register operations is about 40 degrees. When the upper limit of the tilt angle is larger than 40 degrees, the operations become less easy to perform. Meanwhile, in the latter case, as a matter of convenience for performing various kinds of work, it is preferred that the movable range of the tilt hinge mechanism be wider than that in the case of performing the register operations.

In Patent Document 1, there are described a tilt mechanism capable of changing an operation angle range depending on conditions such as a normal use condition and a maintenance condition, and a display monitor including the tilt mechanism. In Patent Document 1, five embodiments are described. In all of the embodiment, as described in claim 1 of Patent Document 1, a third member, which is removably mountable, is provided to change the operation angle range.

PRIOR ART DOCUMENTS

Patent Document

Patent Document 1: JP 2002-106542 A

SUMMARY OF THE INVENTION

Problem to be Solved by the Invention

For example, in Embodiment 1 of Patent Document 1, when the movable range is to be reduced, a cover (5a) including the third member, that is, a stopper contact portion (51a) corresponding to the third member is mounted to a stand (2). When the movable range is to be increased, the cover (5a) is removed from the stand (2). In order to clearly make differences from reference symbols of the subject application, the reference symbols of Patent Document 1 are put in parentheses.

As described above, in the tilt mechanism of Patent Document 1, it is necessary to remove the third member when the movable range is to be increased. Accordingly, there is a risk of loss of the third member while maintenance work is performed under a state in which the third member is removed.

This invention has been made in view of such a circumstance, and an object to be achieved by this invention is to provide a tilt hinge unit capable of changing a movable range without mounting and removing a component, a display apparatus including the tilt hinge unit, and a method of limiting a pivoting angle range of a hinge structure.

Means to Solve the Problem

In order to solve the problem mentioned above, this invention provides, as an aspect of the present invention, a hinge unit comprising a first member; a second member; a coupling member configured to couple the first member and the second member to each other in a pivotable manner; a first stopper member fixed to the first member; and a first limiting member capable of being fixed to at least two positions of the second member, the first limiting member being configured to limit a mutually pivotable angle between the first member and the second member within a first angle range in such a manner that the first limiting member is brought into contact with the first stopper member when the first limiting member is fixed at a position (P1) of the second member, and being held in non-contact with the first stopper member irrespective of a pivoting angle when the first limiting member is fixed at a position (P2) of the second member.

As another aspect of the present invention, this invention provides a method of limiting a pivoting angle of a hinge unit comprising a first member, a second member, and a coupling member configured to couple the first member and the second member to each other in a pivotable manner, the method comprising: limiting a mutually pivotable angle between the first member and the second member within a first angle range in such a manner that a first limiting member and a first stopper member fixed to the first member are brought into contact with each other when the first limiting member is fixed at a position (P1) of the second member; and holding the first limiting member and the first stopper member in non-contact with each other irrespective of a pivoting angle when the first limiting member is fixed at a position (P2) of the second member different from the position (P1), and imposing, by the first limiting member, no limitation on a pivotable angle of the second member with respect to the first member.

Effect of the Invention

According to this invention, there can be provided the tilt hinge unit capable of changing the movable range without mounting and removing a component, the display apparatus including the tilt hinge unit, and the method of limiting the pivoting angle range of the hinge structure.

MODES FOR EMBODYING THE INVENTION

Embodiment 1

A tilt hinge unit 1 according to one embodiment of this invention is described. The tilt hinge unit 1 couples two components to each other in a pivotable manner. As the two components to be coupled to each other, there are exemplified a casing that houses a display of a display-integrated information processing apparatus or the like, and a casing that houses a power source or the like.

Figure 1:
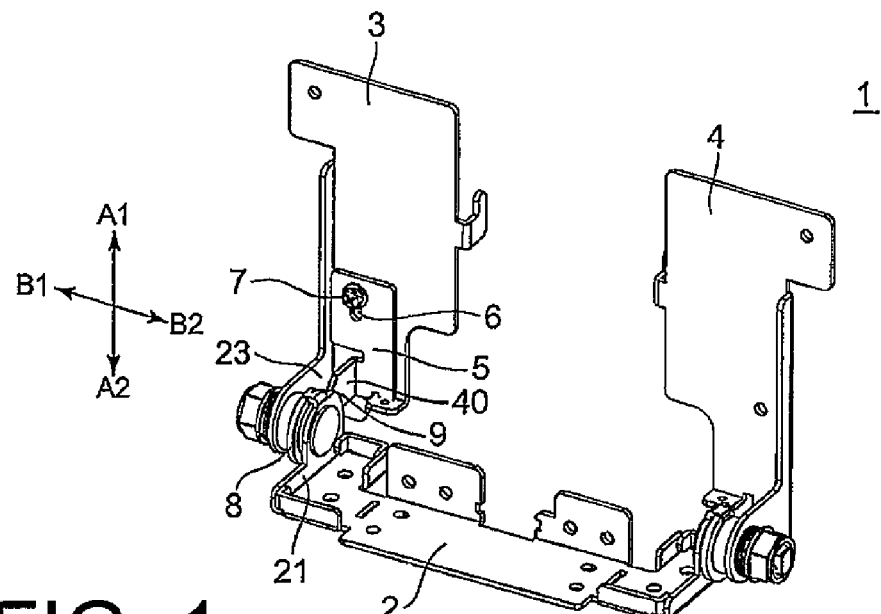
FIG. 1 is a perspective view of a tilt hinge unit 1 according to one embodiment of this invention when a tilt stopper 5 is at a position P1.
Figure 2:
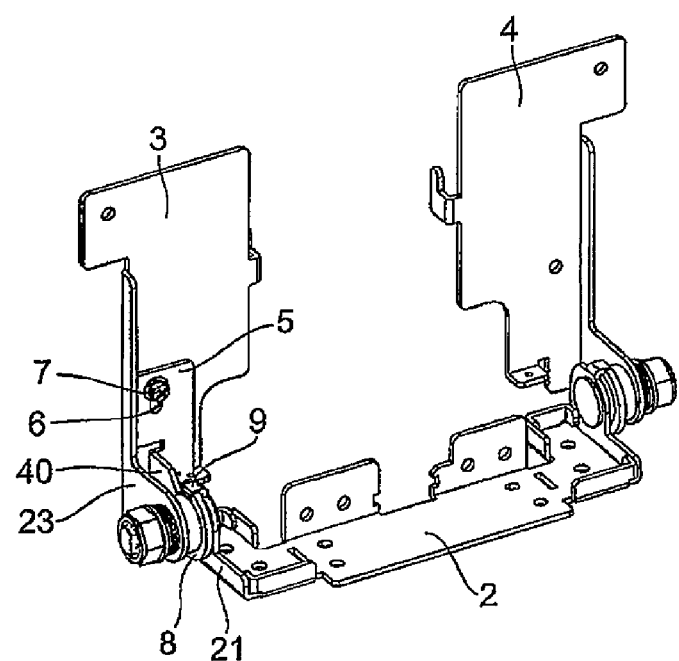
FIG. 2 is a perspective view of the tilt hinge unit 1 when the tilt stopper 5 is at the position P1.

As illustrated in FIG. 1 and FIG. 2, the tilt hinge unit 1 includes a first member 2, second members 3 and 4, and a tilt stopper 5. The first member 2 is fixed to one of the components to be coupled by the tilt hinge unit 1 (for example, a casing that houses a power source apparatus or the like). The second members 3 and 4 are fixed to another one of the components to be coupled by the tilt hinge unit 1 (for example, a casing that houses a LCD or the like). The first member 2 and the second members 3 and 4 are coupled to each other in a pivotable manner. The tilt stopper 5 functions as a first limiting member.

A cutout disc 8 is fixed to the second member 3. The cutout disc 8 is pivoted along with pivoting of the second member 3. A protrusion 9 is fixed to the first member 2. The cutout disc 8 functions as a second limiting member, and the protrusion 9 functions as a first stopper member and a second stopper member. When the second member 3 is intended to pivot by an angle larger than a predetermined angle, the cutout disc 8 is brought into contact with the protrusion 9 to inhibit pivoting of the second member 3. In this manner, the cutout disc 8 limits a pivotable angle range of the second member 3. In the following, an upper limit of a range of a tilt angle formed by the cutout disc 8 and the protrusion 9 is referred to as a first upper limit angle. Further, as illustrated in FIG. 1 and FIG. 2, a magnitude of an inclination of the second member 3 with respect to a vertical direction when the first member 2 is placed on a horizontal plane is referred to as a tilt angle. Therefore, a tilt angle of the second member 3 is 0 degrees when the second member 3 stands vertically upright as illustrated in FIG. 1 and FIG. 2. In this embodiment, the first upper limit angle is 90 degrees (for example, see FIG. 16). Therefore, the tilt angle formed only by the cutout disc 8 and the protrusion 9 is in a range of from 0 degrees to 90 degrees.

The tilt stopper 5 has a through hole 6. A fixing screw 7 is inserted through the through hole 6 and fastened to a corresponding female thread, to thereby fix the tilt stopper 5 to the second member 3. As the female thread corresponding to the fixing screw 7, for example, a nut (not shown) corresponding to the fixing screw 7 may be provided. Alternatively, a screw hole formed in the second member 3, or a screw hole formed in a casing or the like to which the second member 3 is to be fixed may be formed as the female thread. As illustrated in the drawings, the through hole 6 is a through hole with an elongated opening having, for example, an oblong shape or a rectangular shape. A long-side direction of the through hole 6 corresponds to an up-and-down direction of FIG. 1 (direction indicated by the arrows A1 and A2 of FIG. 1), and a short-side direction thereof corresponds to a right-and-left direction of FIG. 1 (direction indicated by the arrows B1 and B2 of FIG. 1). In this specification, an oblong shape or an ellipse shape refers to a shape that has two parallel straight lines having an equal length and two semicircles having an equal radius, specifically, a shape obtained by connecting one ends of the two straight lines to each other by one of the semicircles and connecting another ends thereof to each other by another one of the semicircles. As an ellipse shape, a shape of a track of an athletic field is exemplified.

Positions of fixing the tilt stopper 5 to the second member 3 are selected from two positions. A position of fixing the tilt stopper 5 so as to abut the fixing screw 7 against an upper end of the through hole 6 is referred to as a position P1. A position of fixing the tilt stopper 5 so as to abut the fixing screw 7 against a lower end of the through hole 6 is referred to as a position P2.

When the positions of fixing the tilt stopper 5 are switched between the position P1 and the position P2, it is unnecessary to completely remove the fixing screw 7, and it is enough to only loosen the fixing screw 7 to a shiftable extent. In view of preventing loss or the like of the fixing screw 7, it is preferred that some kind of means be provided for preventing falling off of the fixing screw 7. As such means, for example, it is conceivable to fit a falling-off preventing washer to a back side of the fixing screw 7 with respect to the second member 3 in FIG. 1.

When the tilt stopper 5 is fixed at the position P1, the tilt stopper 5 is fixed to a lower portion of the second member 3 in FIG. 1. At this time, the second member 3 is pivoted so as to incline, that is, tilt from the state illustrated in FIG. 1 to the near side of FIG. 1. Then, although the tilt angle does not reach the first upper limit angle yet, the tilt stopper 5 and the protrusion 9 are brought into contact with each other, to thereby prevent the second member 3 from being further pivoted. In the following, an upper limit of the tilt angle defined by the tilt stopper 5 fixed at the position P1 is referred to as a second upper limit angle. In this embodiment, the second upper limit angle is 40 degrees.

Meanwhile, when the tilt stopper 5 is fixed at the position P2, the tilt stopper 5 is fixed to an upper portion of the second member 3. At this time, the tilt stopper 5 is moved away from a pivot center. For example, when R1 represents a distance between the pivot center and the tilt stopper 5 at the position P1 (FIG. 11), and R2 represents a distance between the pivot center and the tilt stopper 5 at the position P2 (FIG. 15), a relation of R2>R1 is satisfied. As a result, when the tilt stopper 5 is at the position P2, the tilt stopper 5 is not brought into contact with the protrusion 9 irrespective of the tilt angle. Accordingly, the tilt angle of the tilt hinge unit 1 is limited depending only on whether or not the cutout disc 8 and the protrusion 9 are brought into contact with each other, and a tiltable angle is in a range of from 0 degrees to 90 degrees being the first upper limit angle.

Figure 3:
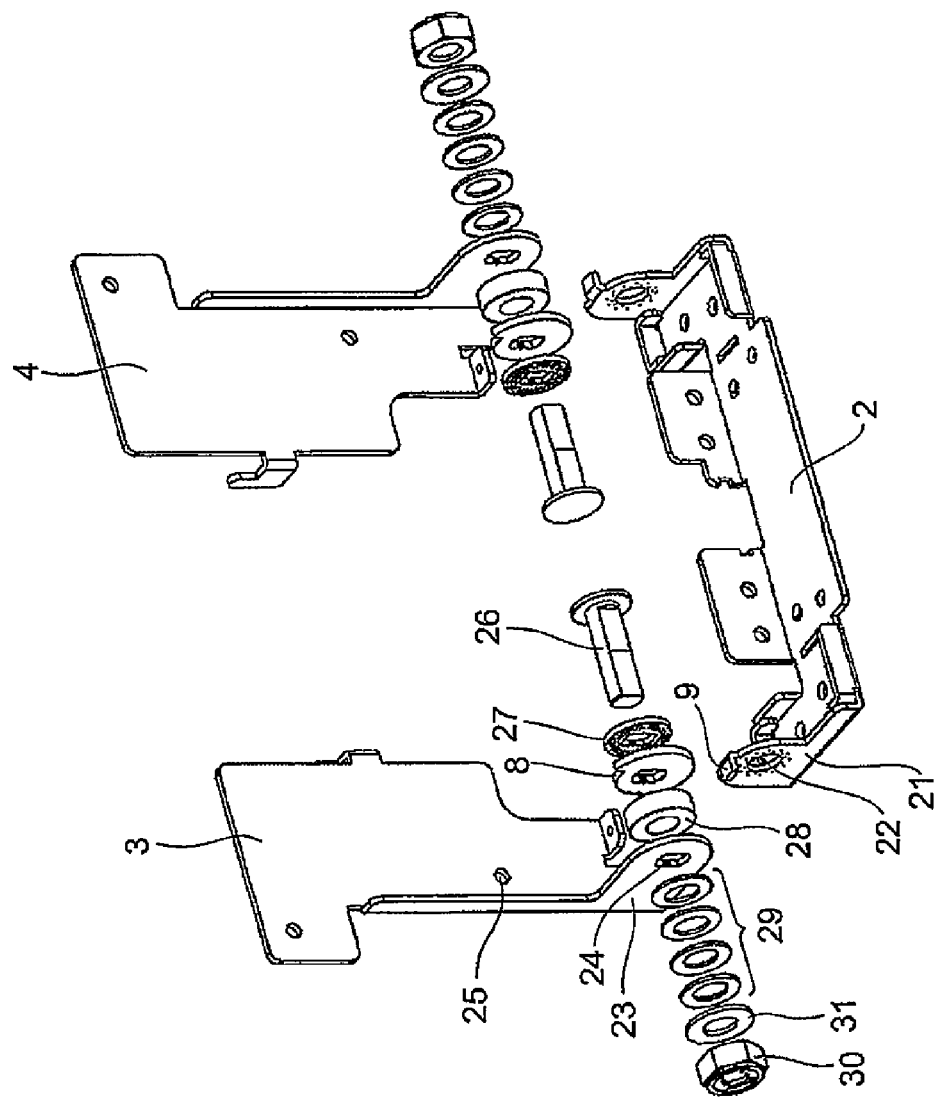
FIG. 3 is an exploded perspective view of the tilt hinge unit 1.
Figure 4:
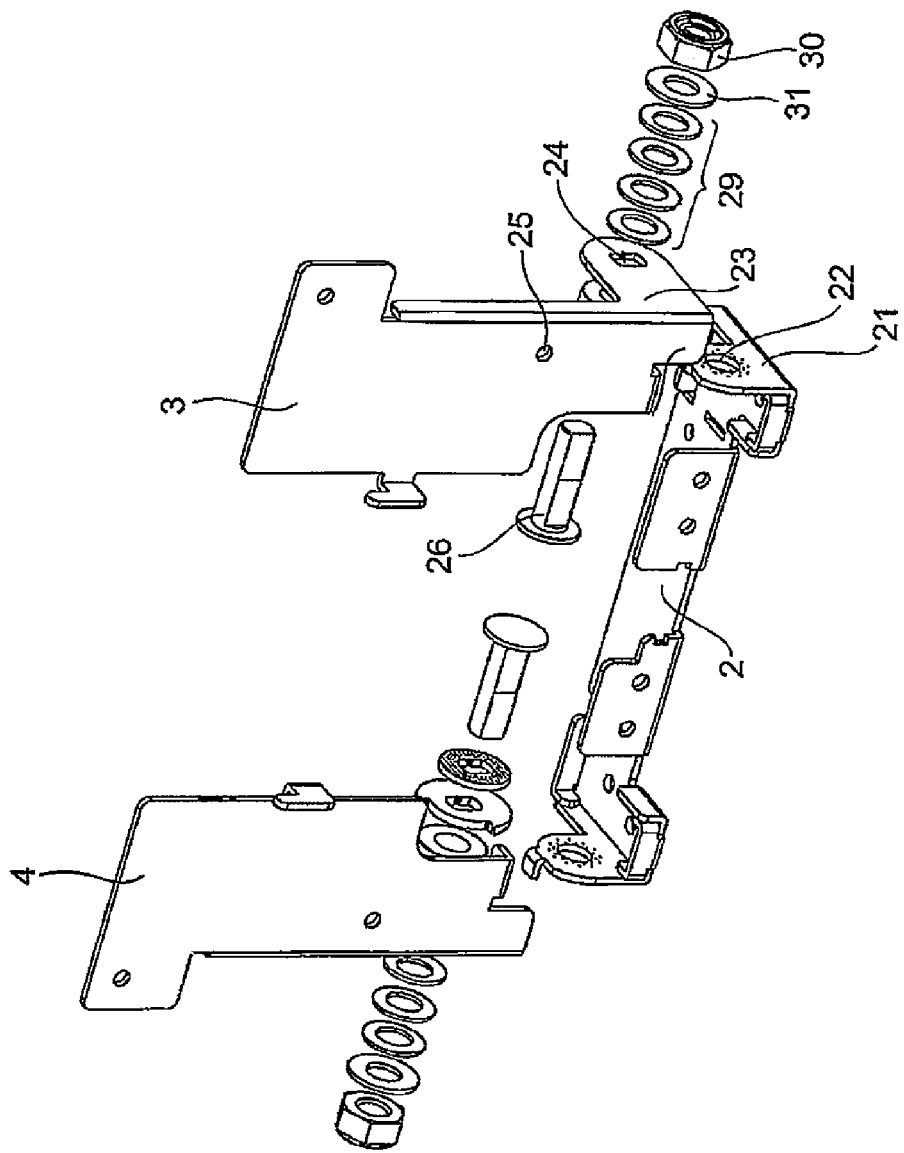
FIG. 4 is an exploded perspective view of the tilt hinge unit 1.

A configuration of the tilt hinge unit 1 is further described in detail with reference to FIG. 3 and FIG. 4. Here, description is made of the configuration and action of the tilt hinge unit 1 under a state in which the tilt stopper 5 is not mounted. The first member 2 is formed by bending a metal plate, and each of right and left end portions of the first member 2 is bent into a support portion 21. The support portion 21 has a bearing hole 22. The second member 3 is formed by bending a metal plate, and a left end portion of the second member 3 is bent into a support portion 23. Similarly, the second member 4 is formed by bending a metal plate, and a right end portion of the second member 4 is bent into the support portion 23. Each support portion 23 has a shaft fixing hole 24. Further, the second member 3 has a through hole 25 for allowing the fixing screw 7 to pass through the second member 3.

The fixing screw 7 passes through the through hole 6 of the tilt stopper 5 and the through hole 25 of the second member 3. Thus, the fixing screw 7 functions as a fixing tool configured to fix, to the second member 3, the tilt stopper 5 functioning as the first limiting member. The through hole 6 is an elongated hole, and hence the position of fixing the tilt stopper 5 to the second member 3 can be selected from the position P1 and the position P2 in accordance with the position of the through hole 6 through which the fixing screw 7 passes.

A bolt 26 is passed through the bearing hole 22 of the first member 2 and the shaft fixing hole 24 of the second member 3 to couple the first member 2 and the second member 3 to each other. A washer 27, the cutout disc 8, and a spacer 28 are interposed between the first member 2 and the second member 3 in the stated order from the right side of FIG. 3, and the bolt 26 passes through the washer 27, the cutout disc 8, and the spacer 28. On an outer side of the second member 3, the bolt 26 further passes through four belleville springs 29 and a washer 31, and is fastened to a nut 30. The belleville springs 29 are flat springs of a washer type.

A shaft of the bolt 26 has an ellipse shape in cross section. Further, an opening of a hole of each of the washer 27, the cutout disc 8, and the shaft fixing hole 24, through which the bolt 26 passes, has an ellipse shape. Accordingly, the second member 3 is pivoted in conjunction with pivoting of the cutout disc 8 through the shaft fixing hole 24 and the bolt 26. As a result, limitation of a pivoting angle performed by the cutout disc 8 and the protrusion 9 affects the tilt angle of the second member 3.

With reference to FIG. 5 to FIG. 8, the limitation of the pivoting angle performed by the cutout disc 8 and the protrusion 9 is further described. The cutout disc 8 has an outer peripheral shape formed by combining two circular arcs that are different in radius. Here, a portion of the outer peripheral shape having a circular arc smaller in radius is referred to as a small-radius arc. The small-radius arc is the portion of the outer peripheral shape as seen from the left sides of FIG. 5 to FIG. 8 along the shaft of the bolt 26.

Figure 5:
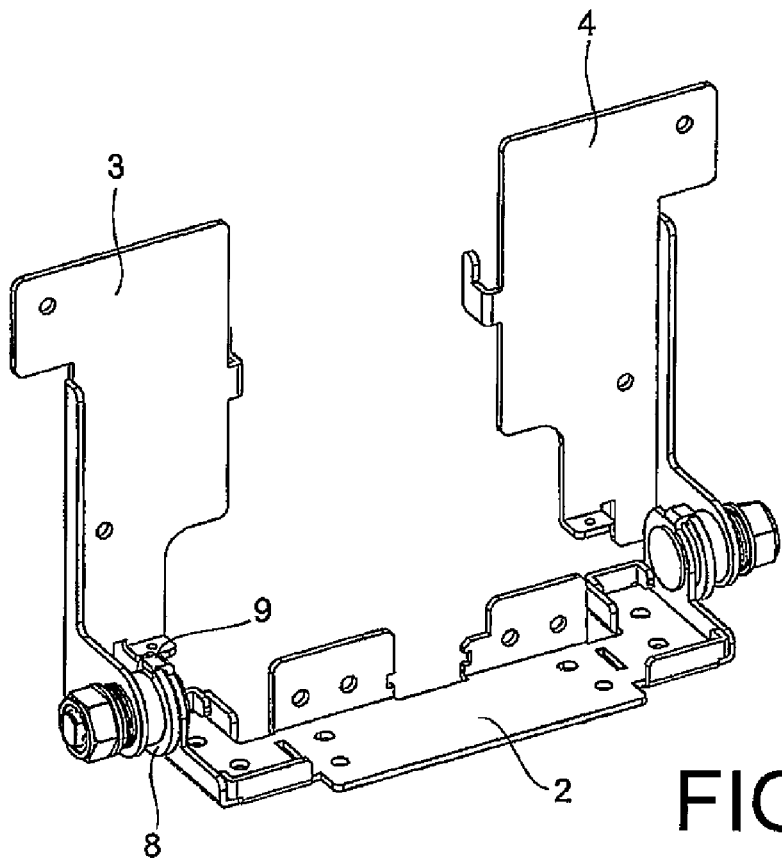
FIG. 5 is a perspective view of the tilt hinge unit 1 when a tilt angle is 0 degrees under a state in which the tilt stopper 5 is removed.
Figure 6:
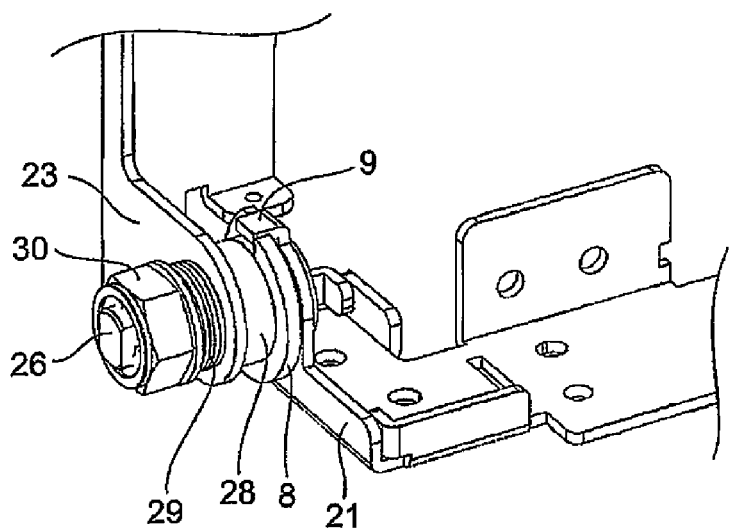
FIG. 6 is an enlarged perspective view of a periphery of a left coupling region of the tilt hinge unit 1 in the state illustrated in FIG. 5.

At this time, as illustrated in FIG. 5 and FIG. 6, a right end portion of the small-radius arc and a surface of the protrusion 9 on the front of the drawing sheet of FIG. 5 or FIG. 6 are brought into contact with each other. In this manner, the second member 3 is prevented from further inclining to the back of the drawing sheet of FIG. 5 or FIG. 6, that is, from tilting at a minus angle. It can be also said that the right end portion of the small-radius arc is arranged at a position corresponding to a lower limit value of the tilt angle.

Figure 7:
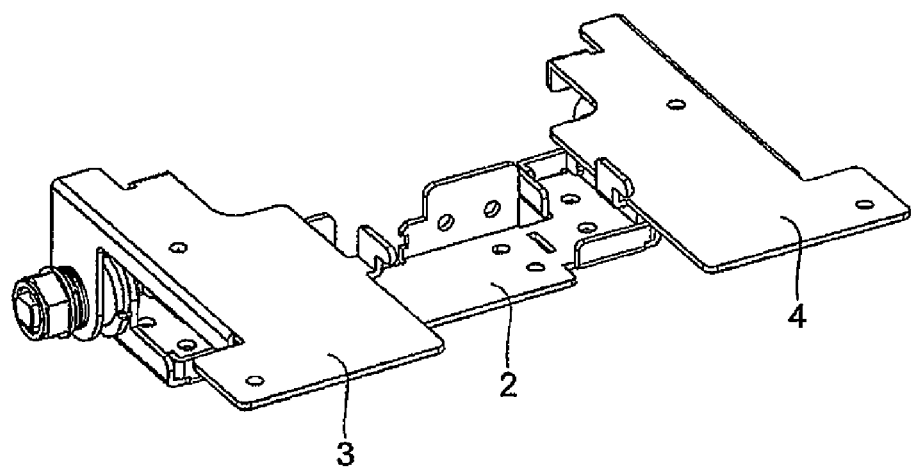
FIG. 7 is a perspective view of the tilt hinge unit 1 when the tilt angle is 90 degrees under the state in which the tilt stopper 5 is removed.
Figure 8:
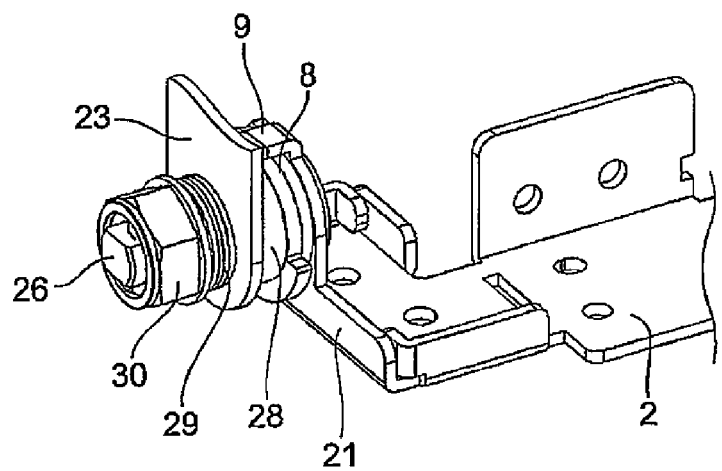
FIG. 8 is an enlarged perspective view of the periphery of the left coupling region of the tilt hinge unit 1 in the state illustrated in FIG. 7, in which portions of a second member 3 other than a support portion 23 is omitted.

Further, at this time, as illustrated in FIG. 7 and FIG. 8, a left end portion of the small-radius arc and a surface of the protrusion 9 on the back of the drawing sheet of FIG. 7 or FIG. 8 are brought into contact with each other. In this manner, the second member 3 is prevented from further inclining to the front of the drawing sheet of FIG. 7 or FIG. 8, that is, from tilting at an angle exceeding the first upper limit angle. It can be also said that the left end portion of the small-radius arc is arranged at a position corresponding to the first upper limit angle of the tilt angle. In FIG. 8, in order to enable easy understanding of a relationship in pivoting between the cutout disc 8 and the protrusion 9, illustrations of portions of the second member 3 other than the support portion 23 are omitted.

In this embodiment, as means for setting the lower limit value (0 degrees) and the first upper limit angle (90 degrees) of the pivotable angle, the cutout disc 8 and the protrusion 9 are used, but other means may be used. For example, instead of using the cutout disc 8, it is conceivable to form, on a surface of the shaft of the bolt 26 at a position corresponding to the protrusion 9 and corresponding to a lower limit value of the tilt angle, such a protruding portion as to be brought into contact with the protrusion 9, and form, on the surface of the shaft of the bolt 26 at a position corresponding to the protrusion 9 and corresponding to a first upper limit value of the tilt angle, such a protruding portion as to be brought into contact with the protrusion 9.

Figure 9:
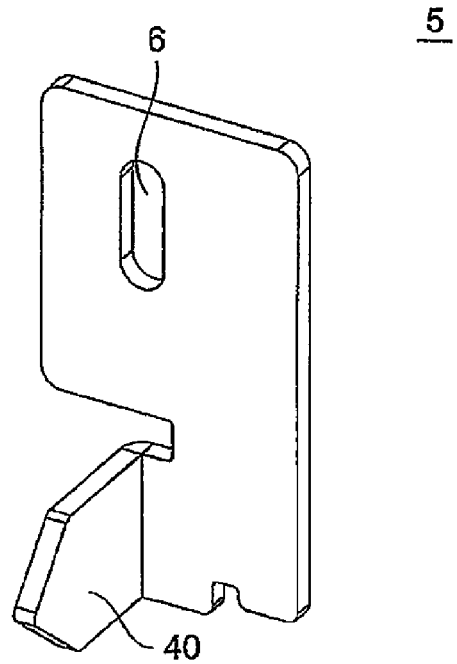
FIG. 9 is a perspective view of the tilt stopper 5.
Figure 10:
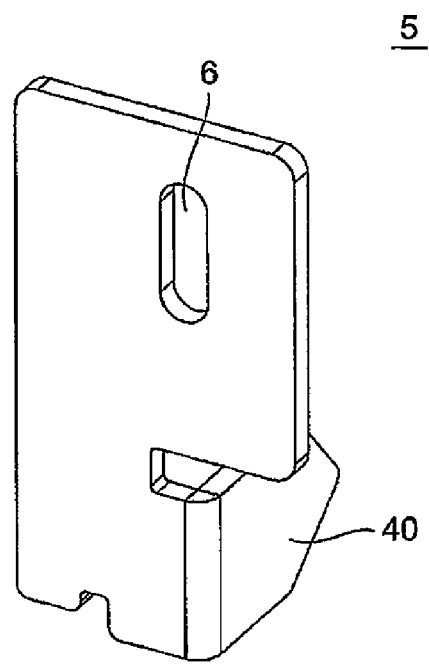
FIG. 10 is a perspective view of the tilt stopper 5 as seen from the back of the drawing sheet of FIG. 9.

The tilt stopper 5 is described with reference to FIG. 9 and FIG. 10. The tilt stopper 5 is formed by, for example, bending a metal plate. As described above, the tilt stopper 5 has the through hole 6 having an elongated opening. Further, the tilt stopper 5 includes a stopper piece 40 extending upright from a flat plate having the through hole 6.

The limitation of the pivoting angle performed by the tilt stopper 5 and the protrusion 9 is described. As described above, the range of the pivoting angle limited by the tilt stopper 5 differs depending on the position of fixing the tilt stopper 5.

Figure 11:
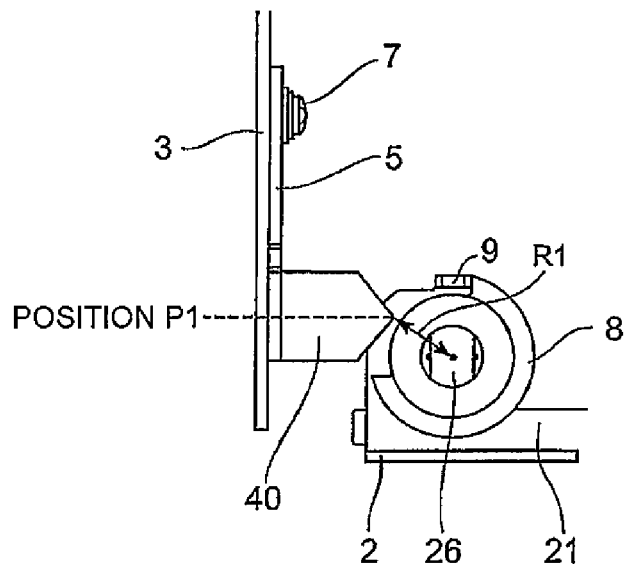
FIG. 11 is a side view for illustrating the left coupling region of the tilt hinge unit 1 when the tilt stopper 5 is fixed at the position P1 and the tilt angle is 0 degrees.
Figure 12:
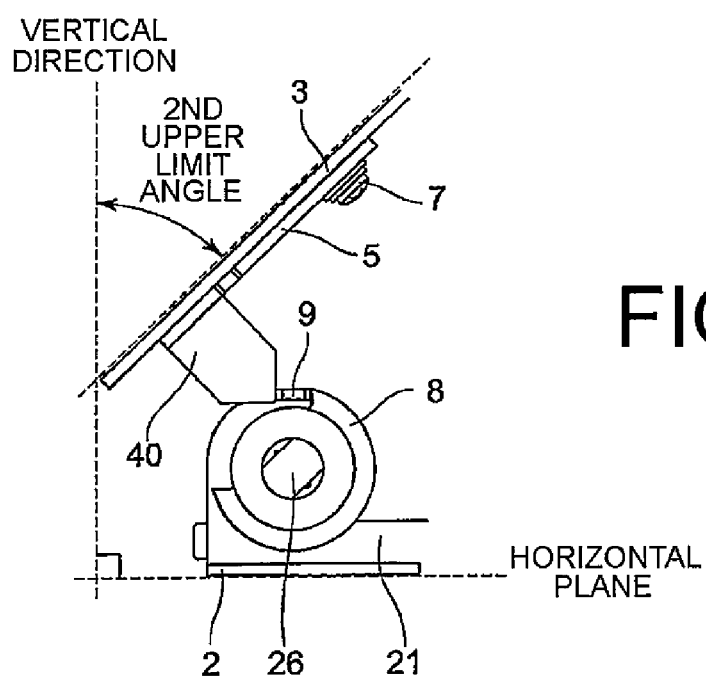
FIG. 12 is a side view for illustrating the left coupling region of the tilt hinge unit 1 when the tilt stopper 5 is fixed at the position P1 and the tilt angle is 40 degrees.

Pivoting of the tilt hinge unit 1 when the tilt stopper 5 is at the position P1 is described. At this time, as illustrated in FIG. 11, a distal end of the stopper piece 40 is arranged at a position in a radial direction of the small-radius arc so as to be able to come into contact with the protrusion 9. At this time, a distance between the distal end of the stopper piece 40 and a center of a pivot shaft, that is, a center of the bolt 26 is represented by R1. The tilt angle is 0 degrees in FIG. 11. When the second member 3 gradually inclines from this angle, as illustrated in FIG. 12, the distal end of the stopper piece 40 and the protrusion 9 are brought into contact with each other so that the tilt angle is not increased any further. The tilt angle at this time is referred to as a second upper limit angle. In this embodiment, the second upper limit angle is 40 degrees. Although the tilt angle does not reach 90 degrees being the first upper limit angle, the second member 3 cannot incline any further due to operation of the tilt stopper 5 and the protrusion 9. This may be understood from FIG. 12.

Figure 13:
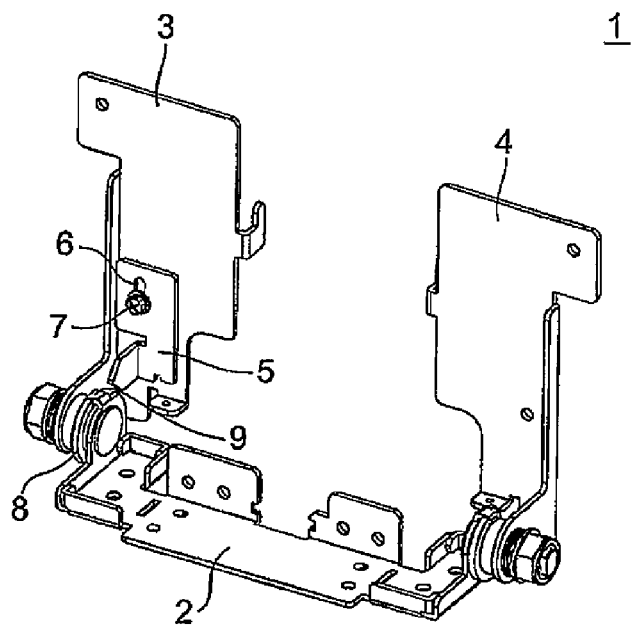
FIG. 13 is a perspective view of the tilt hinge unit 1 when the tilt stopper 5 is at a position P2.
Figure 14:
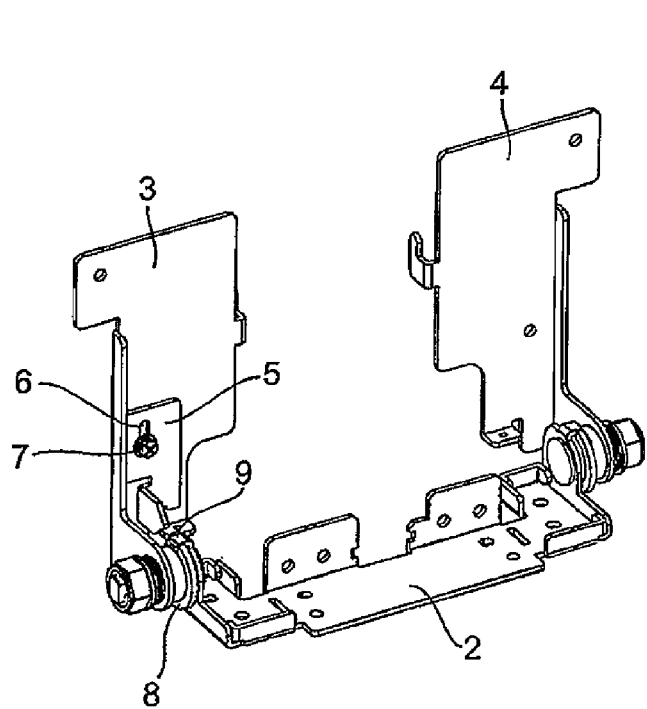
FIG. 14 is a perspective view of the tilt hinge unit 1 as seen from an angle different from that of FIG. 13 when the tilt stopper 5 is at the position P2.

Next, pivoting of the tilt hinge unit 1 when the tilt stopper 5 is at the position P2 is described. That is, as illustrated in FIG. 13 and FIG. 14, the tilt stopper 5 is fixed so that the fixing screw 7 abuts against the lower end of the through hole 6.

Figure 15:
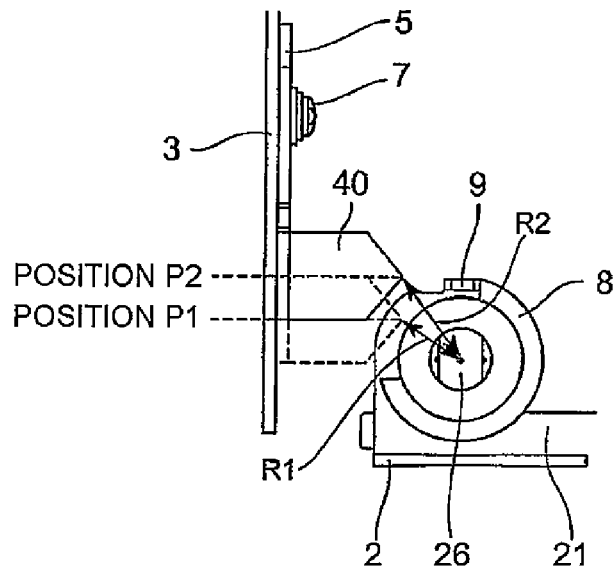
FIG. 15 is a side view for illustrating the left coupling region of the tilt hinge unit 1 when the tilt stopper 5 is fixed at the position P2 and the tilt angle is 0 degrees.
Figure 16:
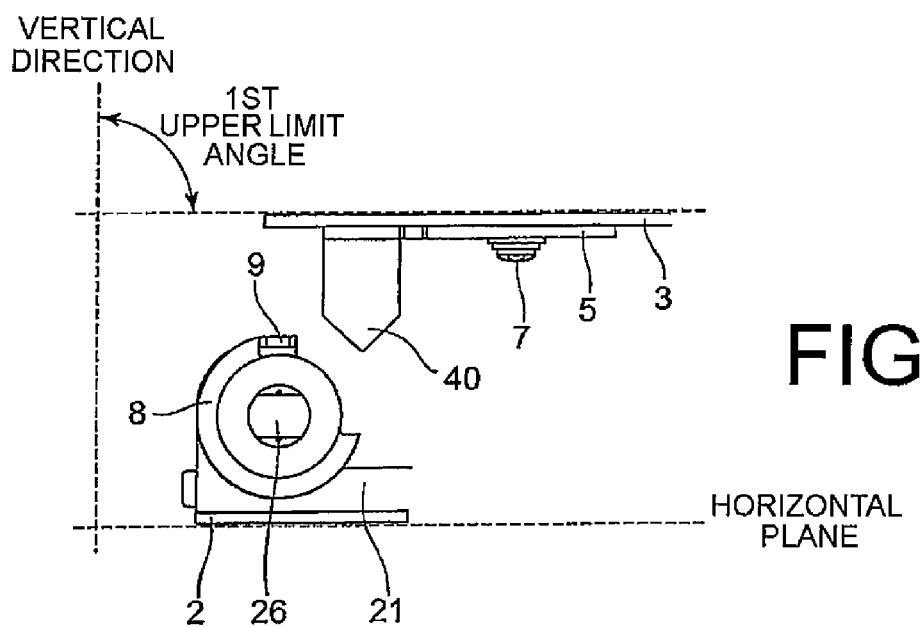
FIG. 16 is a side view for illustrating the left coupling region of the tilt hinge unit 1 when the tilt stopper 5 is fixed at the position P2 and the tilt angle is 90 degrees.

At this time, as illustrated in FIG. 15, the distal end of the stopper piece 40 is moved away from the position P1 and arranged at a position in the radial direction of the small-radius arc so as to be unable to come into contact with the protrusion 9 even when the tilt hinge unit 1 is pivoted. Accordingly, the tilt stopper 5 does not limit the pivoting angle in the least. As illustrated in FIG. 16, the stopper piece 40 and the protrusion 9 are not brought into contact with each other, but the cutout disc 8 and the protrusion 9 are brought into contact with each other. Thus, the tilt angle is limited up to the first upper limit angle. In a case where R2 represents a distance between the distal end of the stopper piece 40 and the center of the pivot shaft, the relation of R2>R1 is satisfied when the stopper piece 40 is at the position P2.

As described above, according to Embodiment 1, when the tilt stopper 5 is at the position P1, the tilt angle is limited within a range of from 0 degrees to the second upper limit angle due to the operation of the tilt stopper 5 and the protrusion 9. Meanwhile, when the tilt stopper 5 is at the position P2, the tilt angle is limited within a range of from 0 degrees to the first upper limit angle due to operation of the cutout disc 8 and the protrusion 9. Further, during a process of switching the two pivoting angle ranges, it is not necessary to remove a component from the tilt hinge unit 1. Accordingly, there is no risk of loss of a component such as the tilt stopper 5 during this process.

Embodiment 2

The tilt hinge unit 1 described in Embodiment 1 is applicable to a variety of apparatus including a tilt hinge mechanism. For example, it is conceivable that the tilt hinge unit 1 couples together a display body of a display apparatus and a base supporting the display body. Alternatively, it is conceivable that, in a display-integrated information processing apparatus integrally including a display apparatus and an information processing apparatus, the tilt hinge unit 1 is used as a hinge mechanism configured to couple the display apparatus and the information processing apparatus to each other. Here, a point-of-sales (POS) terminal apparatus 50 including the tilt hinge unit 1 is described in Embodiment 2.

Figure 17:
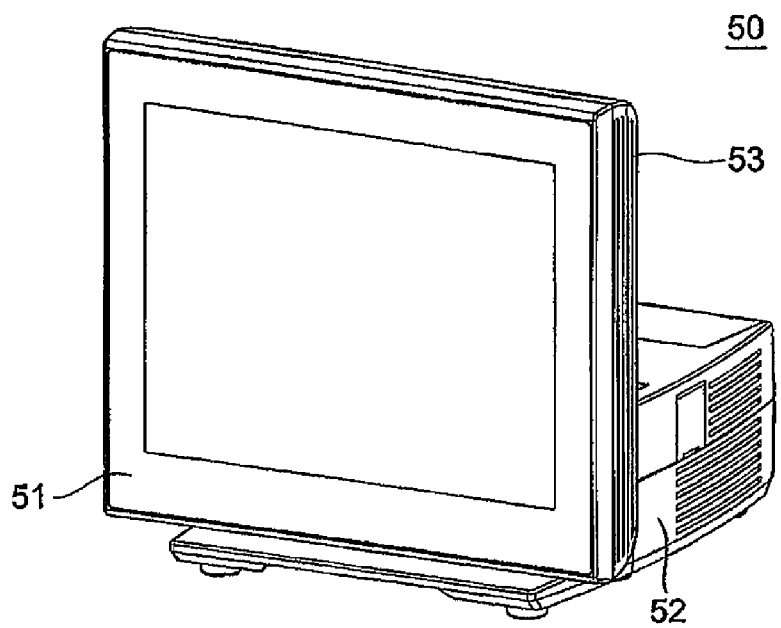
FIG. 17 is a perspective view of a POS terminal apparatus 50 of one embodiment of this invention.
Figure 18:
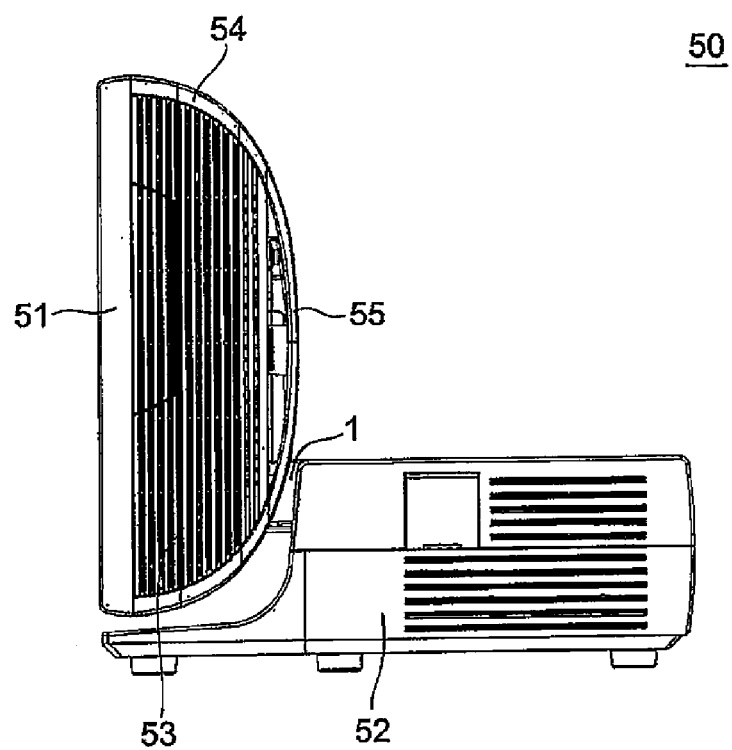
FIG. 18 is a side view of the POS terminal apparatus 50.

As illustrated in FIG. 17 and FIG. 18, the POS terminal apparatus 50 is constructed by coupling a display unit 51 and a base unit 52 to each other by the tilt hinge unit 1. A touch panel, a display such as a liquid crystal display (LCD), a control unit configured to control the entire apparatus, and the like are built in the display unit 51. The touch panel may be omitted from the display unit 51. An AC/DC power source apparatus and the like are built in the base unit 52. In addition, the display unit 51 includes side covers 53 configured to cover right and left side surfaces of the display unit 51, a top cover 54 configured to cover an upper portion of a back surface of the display unit 51, and a rear cover 55 configured to cover a center of the back surface of the display unit 51.

Figure 19:
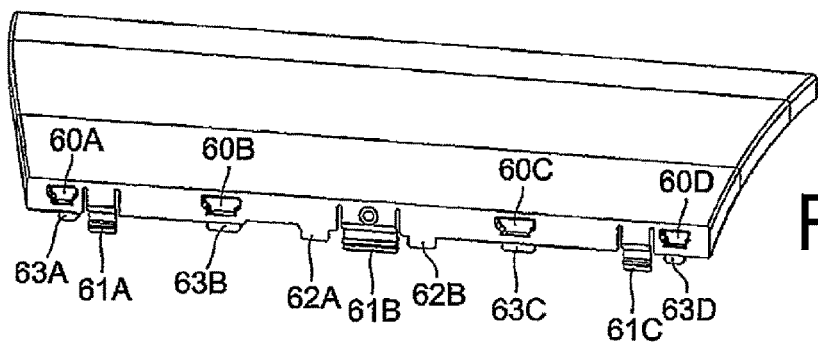
FIG. 19 is a perspective view of a top cover 54 of the POS terminal apparatus 50.
Figure 20:
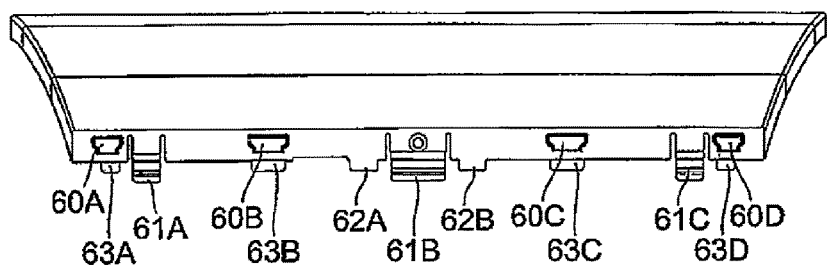
FIG. 20 is a front view of the top cover 54 as seen from a front side of the top cover 54, or from a rear side of the POS terminal apparatus 50.
Figure 21:
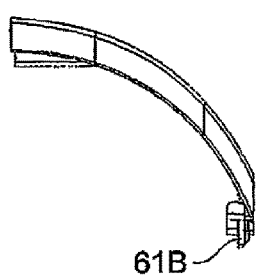
FIG. 21 is a side view of the top cover 54.
Figure 22:
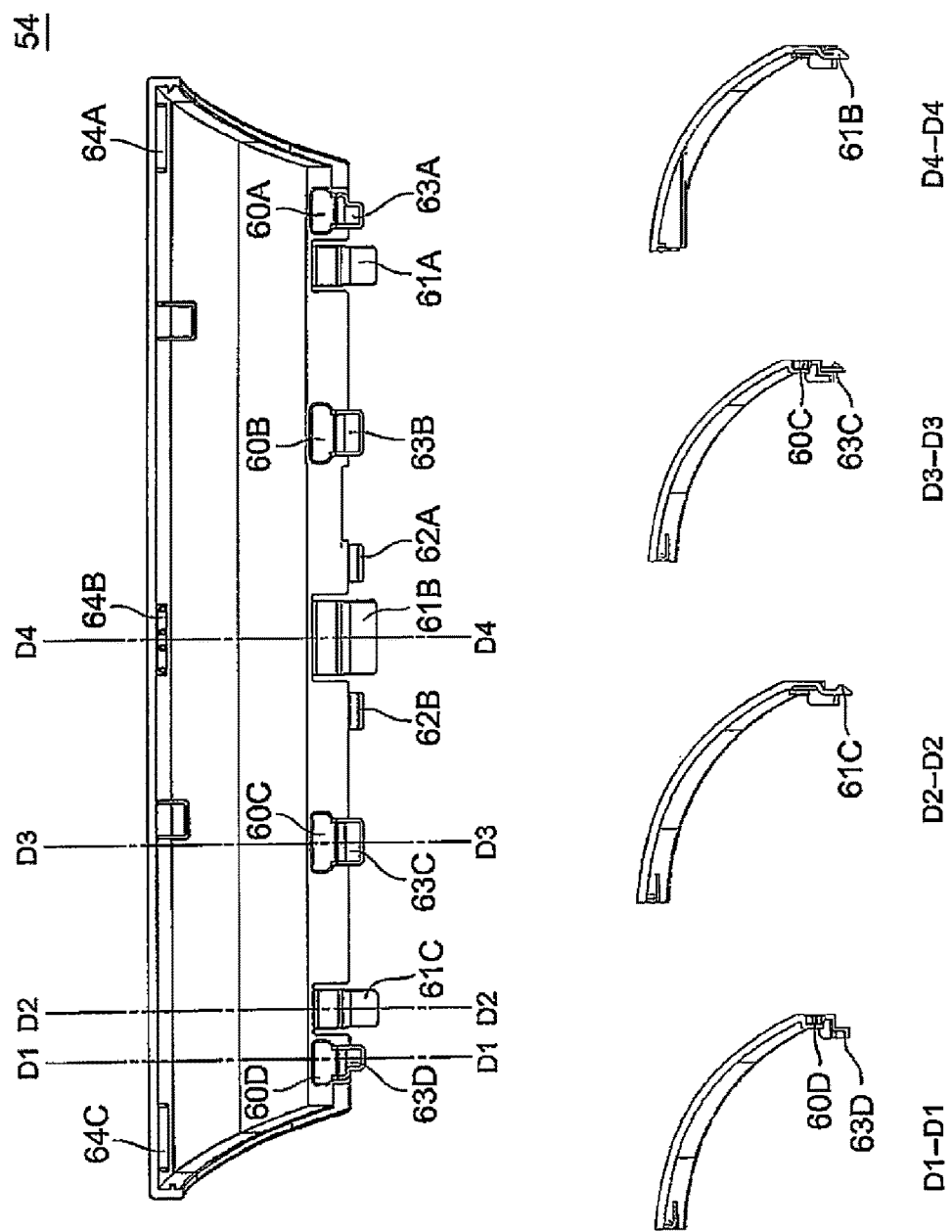
FIG. 22 includes a front view of the top cover 54 as seen from a back side of the top cover 54, or from a front side of the POS terminal apparatus 50, and side views of a D1-D1 cross section, a D2-D2 cross section, a D3-D3 cross section, and a D4-D4 cross section as seen from the right side of the drawing sheet of FIG. 22.

The top cover 54 is described. As illustrated in FIG. 19 to FIG. 21, the top cover 54 has engagement holes 60A to 60D that are formed in a lower surface portion thereof and are respectively engaged with engagement protrusions 70A to 70D of the rear cover 55 (see FIG. 23). Further, the top cover 54 includes engagement claws 61A to 61C that are engaged with engagement holes 85A to 85C of an outer frame 80 (see FIG. 28). Further, the top cover 54 includes first positioning protrusions 62A and 62B and second positioning protrusions 63A to 63D. As illustrated in FIG. 22, the top cover 54 includes engagement protrusions 64A to 64C that are formed on an upper surface portion thereof and are respectively engaged with engagement recesses 84A to 84C in an upper surface portion of the outer frame 80 (see FIG. 28). When the top cover 54 is mounted to the outer frame 80, a worker or the like mounts the top cover 54 by pulling down the top cover 54 from an upper side to a lower side of the outer frame 80. The engagement protrusions 70A to 70D of the rear cover 55 and the outer frame 80 are described later.

Figure 23:
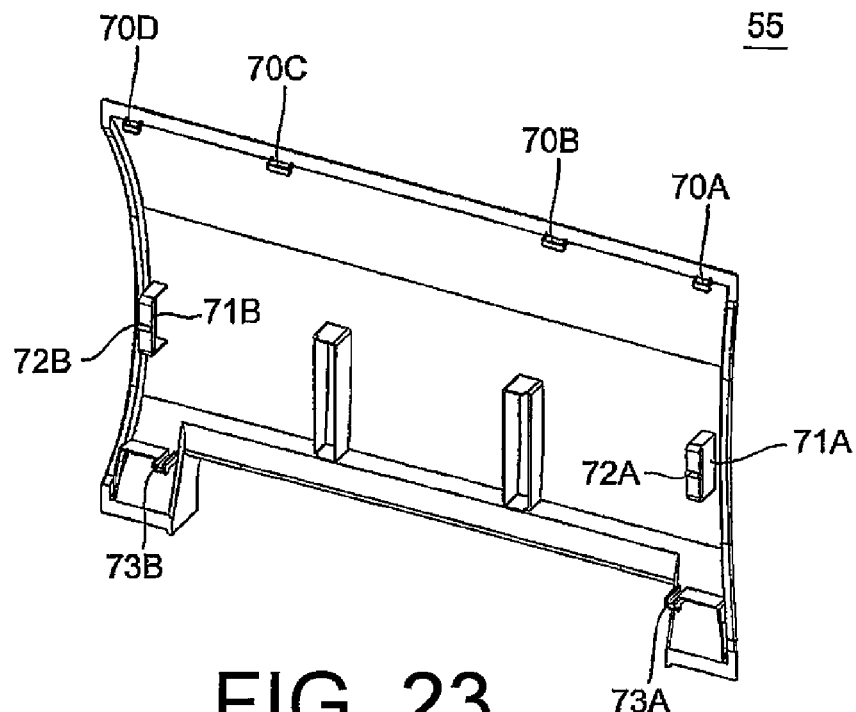
FIG. 23 is a perspective view of a rear cover 55.
Figure 25:
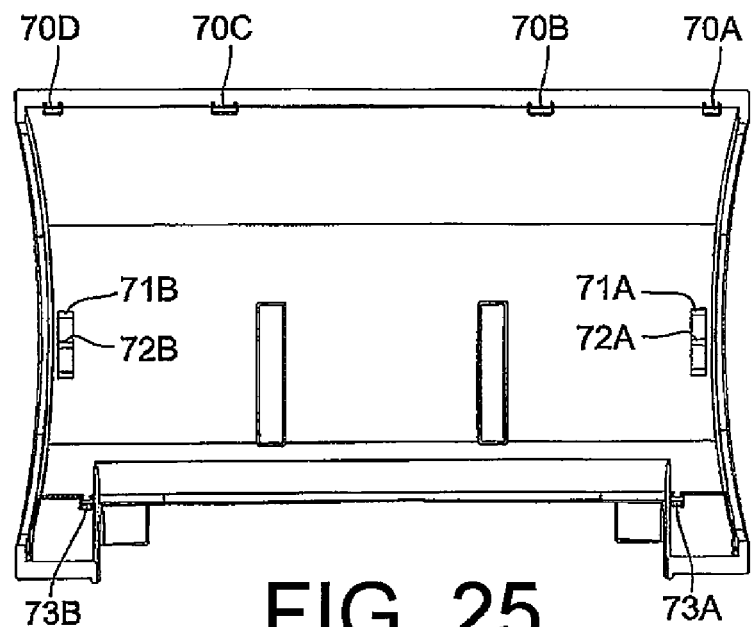
FIG. 25 is a front view of the rear cover 55.

The rear cover 55 is described. As illustrated in FIG. 23 and FIG. 25, the rear cover 55 includes the engagement protrusions 70A to 70D that are respectively engaged with the engagement holes 60A to 60D of the top cover 54. Further, the rear cover 55 includes projections 71A and 71B that are formed on right and left end portions of a center portion of the rear cover 55 so as to be brought into contact with the outer frame 80 (see FIG. 28). Projection protruding portions 72A and 72B are formed on a front surface of the projection 71A and a front surface of the projection 71B, respectively. The projections 71A and 71B and the projection protruding portions 72A and 72B are made of an elastic material such as a resin. The rear cover 55 includes engagement protrusions 73A and 73B that are formed on a lower surface portion thereof and are respectively engaged with engagement holes 82A and 82B of the outer frame 80 (see FIG. 28).

Figure 24:
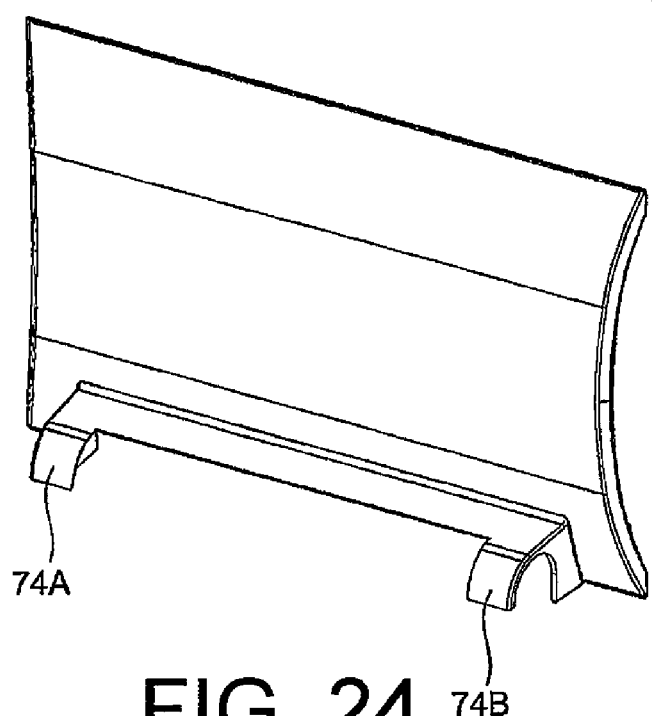
FIG. 24 is a perspective view of the rear cover 55 as seen from the back of the drawing sheet of FIG. 23.
Figure 26:
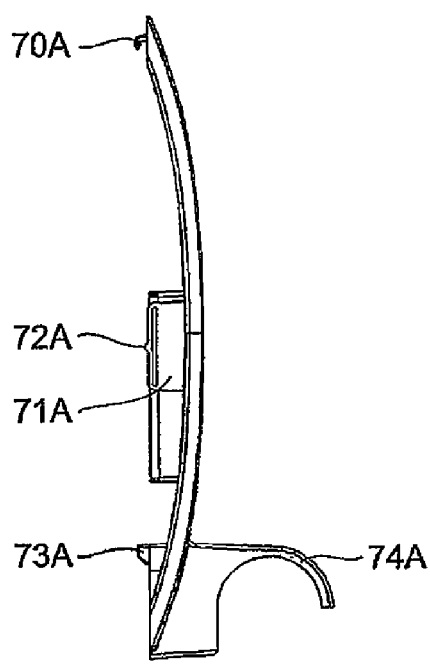
FIG. 26 is a side view of the rear cover 55.

In addition, as illustrated in FIG. 24 and FIG. 26, the rear cover 55 includes coupling region covers 74A and 74B. Each of the coupling region covers 74A and 74B is configured to cover the stopper piece 40 when the tilt stopper 5 is at the position P1, and is configured to be brought into contact with the stopper piece 40 when the tilt stopper 5 is at the position P2.

The rear cover 55 is mounted after the top cover 54 is mounted to the outer frame 80. A worker or the like mounts the rear cover 55 by pulling down the rear cover 55 from the upper side to the lower side of the outer frame 80 after bringing the top cover 54 and the outer frame 80 into contact with each other.

When the rear cover 55 is mounted to the outer frame 80, the projections 71A and 71B are pushed against a rear surface of the outer frame 80. At this time, when a force is applied to the projection protruding portions 72A and 72B, the projections 71A and 71B are elastically deformed so that the projection protruding portions 72A and 72B are slightly retreated from the illustrated positions. When the rear cover 55 is mounted to a proper position of the rear surface of the outer frame 80, the projection protruding portions 72A and 72B are fitted into fitting holes 81A and 81B formed in the rear surface of the outer frame 80. At this time, owing to the action of the elastic force, the projection protruding portions 72A and 72B are returned from the retreated positions to the original positions, to thereby generate a click feeling. This click feeling allows a person who performs mounting work to know that the rear cover 55 is mounted to the proper position.

As described above, the rear cover 55 includes various protrusions, various projections, and the like that are engaged with the top cover 54 and the outer frame 80. Those protrusions and projections act as means for determining a proper mounting state of the rear cover 55.

Figure 27:
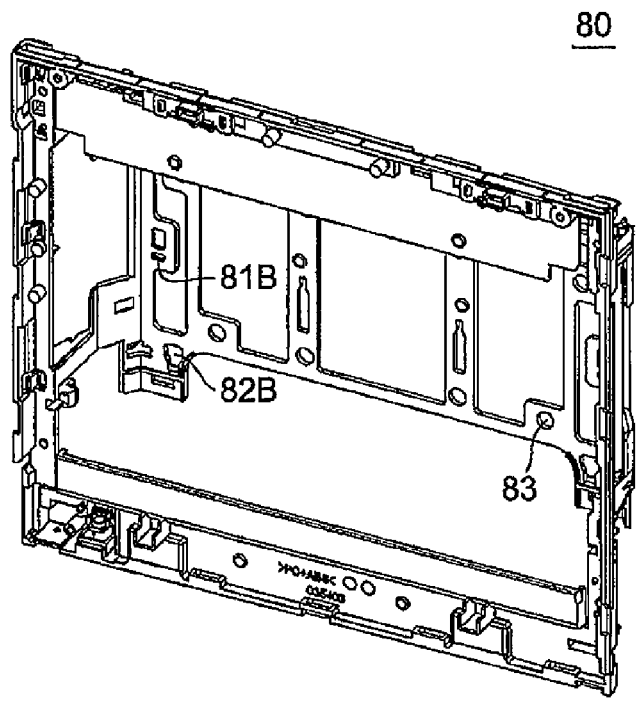
FIG. 27 is a perspective view of an outer frame 80 as seen from the front side of the POS terminal apparatus 50.
Figure 28:
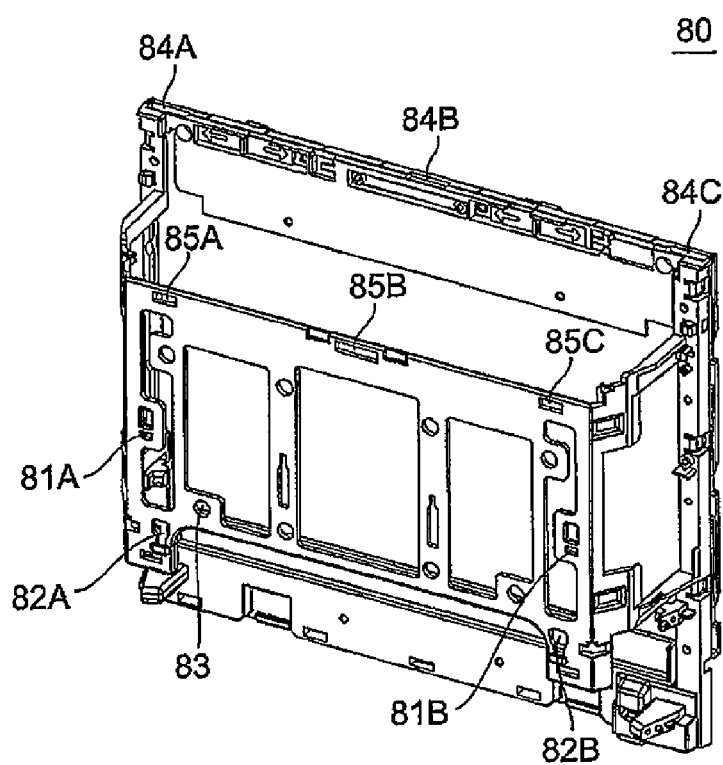
FIG. 28 is a perspective view of the outer frame 80 as seen from a rear side of the POS terminal apparatus 50.

The outer frame 80 is described. The outer frame 80 is a resin-molded product. The outer frame 80 supports the display (not shown) including the touch panel, the LCD, and the like. Further, an inner frame 90 to be described later is housed inside the outer frame 80. As illustrated in FIG. 27 and FIG. 28, the fitting holes 81A and 81B, the engagement holes 82A and 82B, a fixing screw through hole 83, the engagement recesses 84A to 84C, and the engagement holes 85A to 85C are formed in the outer frame 80. The fixing screw through hole 83 is a hole through which the fixing screw 7 is passed.

Figure 29:
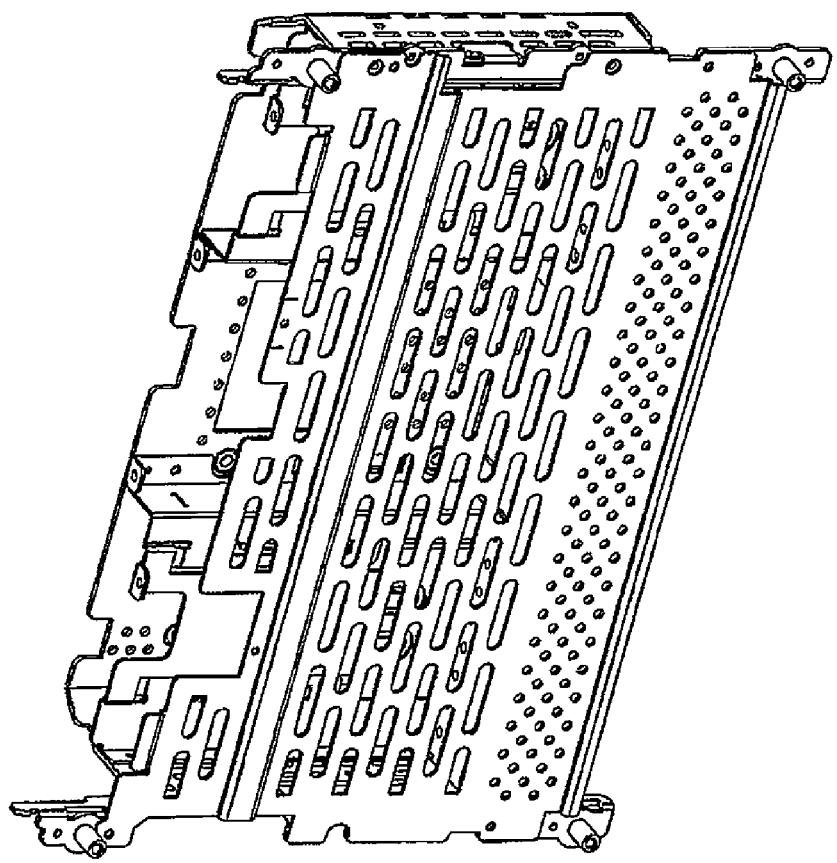
FIG. 29 is a perspective view of an inner frame 90 as seen from the front side of the POS terminal apparatus 50.
Figure 30:
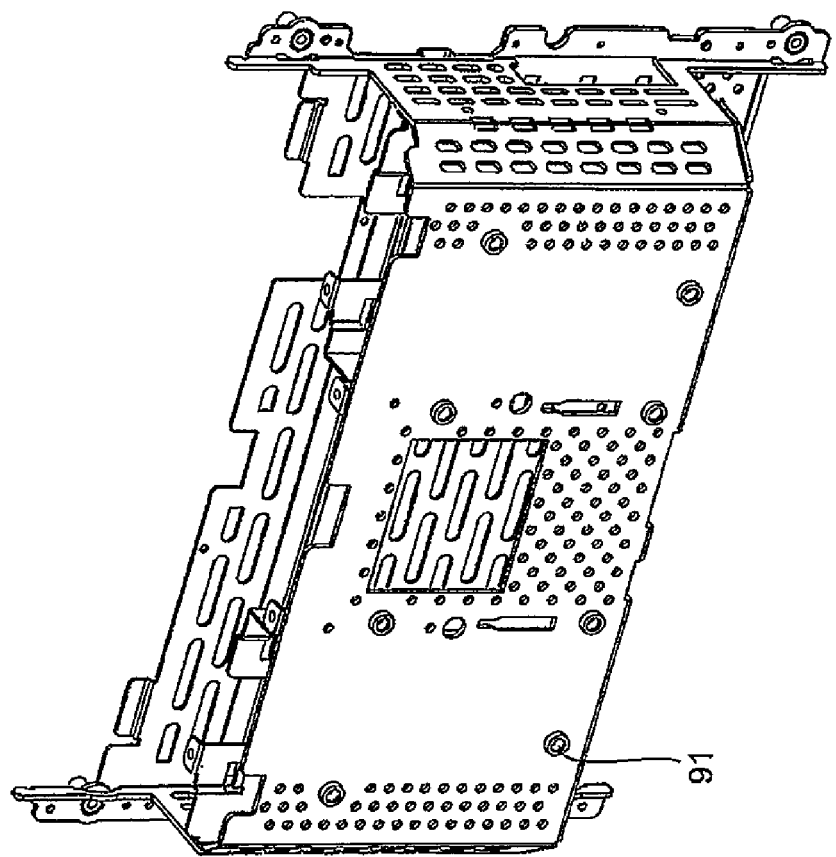
FIG. 30 is a perspective view of the inner frame 90 as seen from the rear side of the POS terminal apparatus 50.

The inner frame 90 is described. As illustrated in FIG. 29 and FIG. 30, the inner frame 90 is a frame obtained by combining a plurality of bent metal plates together. A screw hole 91 to be fastened to the fixing screw 7 is formed in the inner frame 90.

Figure 31:
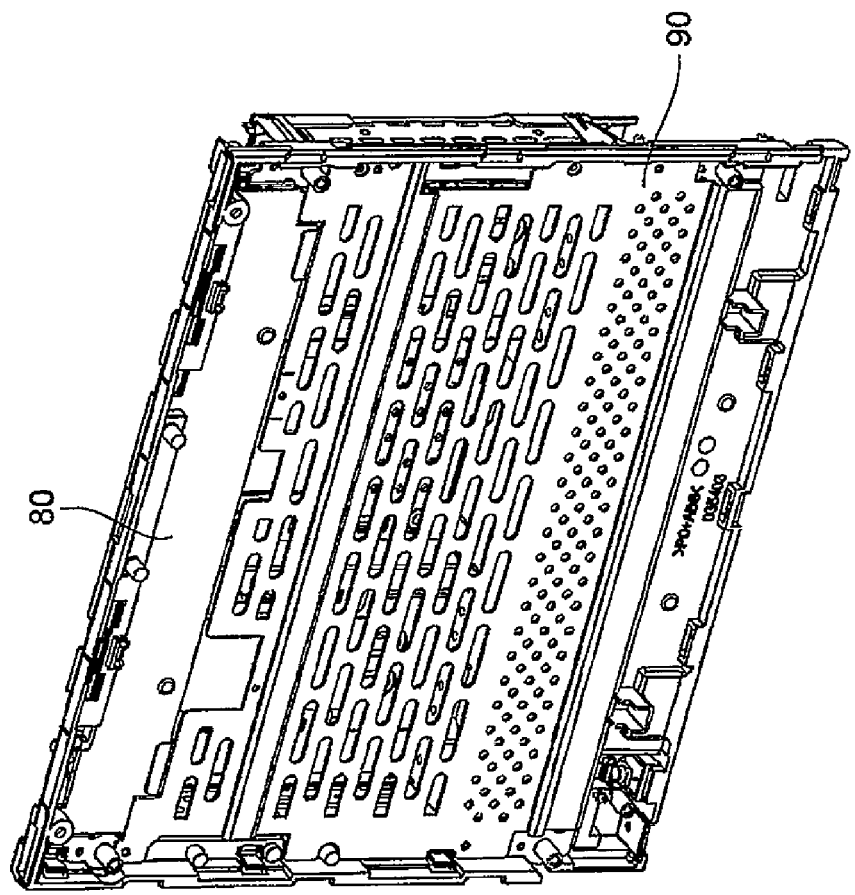
FIG. 31 is a perspective view of the outer frame 80, into which the inner frame 90 is incorporated, as seen from the front side of the POS terminal apparatus 50.
Figure 32:
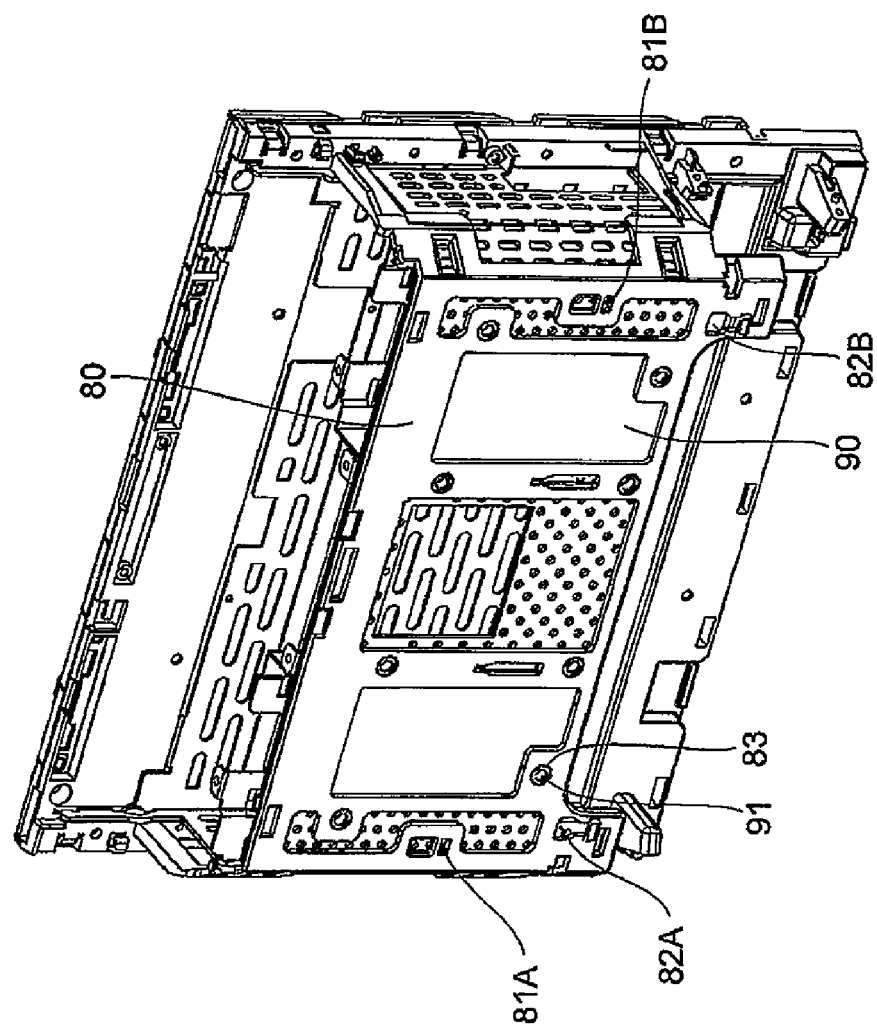
FIG. 32 is a perspective view of the outer frame 80, into which the inner frame 90 is incorporated, as seen from the rear side of the POS terminal apparatus 50.

As illustrated in FIG. 31 and FIG. 32, the inner frame 90 is housed in the outer frame 80. The fixing screw through hole 83 and the screw hole 91 are arranged so as to be concentric with each other. When the tilt stopper 5 is mounted to the display unit 51, the fixing screw 7 is passed through the through hole 6 and the fixing screw through hole 83 in the stated order, and then the fixing screw 7 and the screw hole 91 are fastened to each other.

Figure 33:
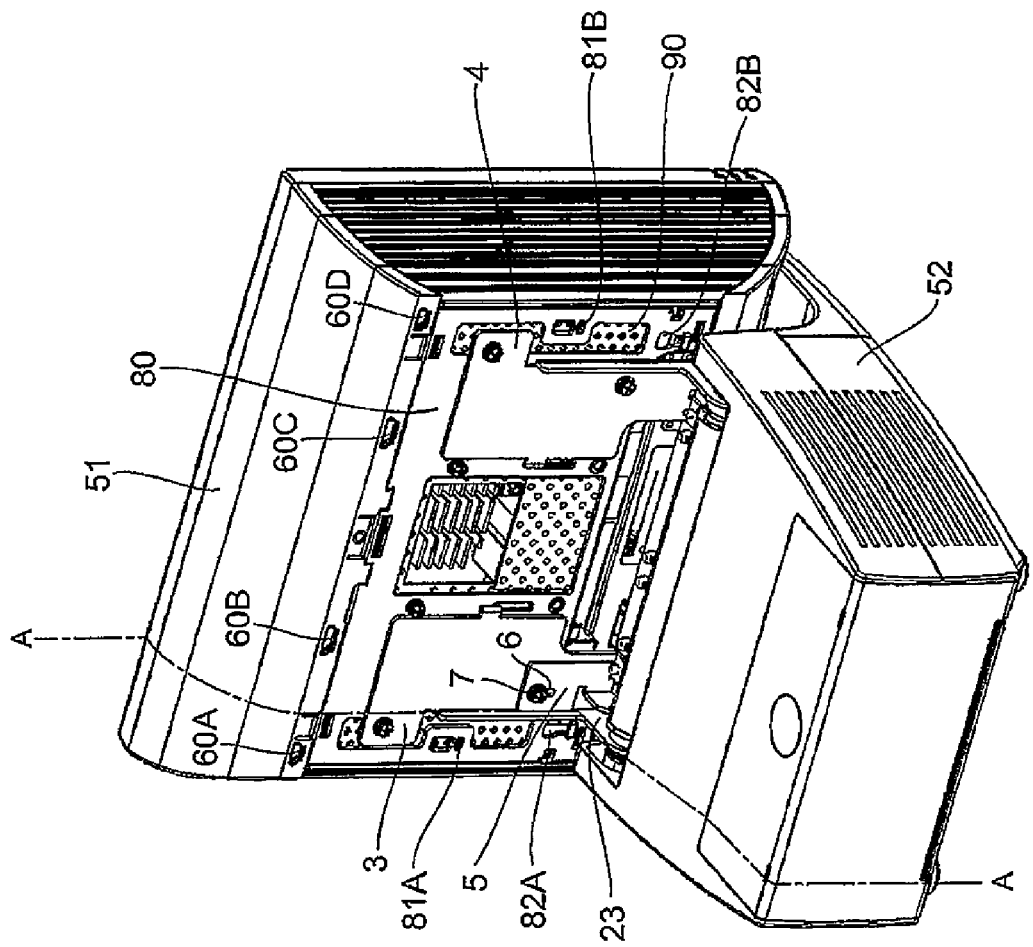
FIG. 33 is a perspective view of the POS terminal apparatus 50 as seen from the rear side thereof when the tilt stopper 5 is fixed at the position P1, the rear cover 55 is removed, and the tilt angle is 0 degrees, for illustrating a position of an A-A cross section.

Next, tilting operation of the display unit 51 in the POS terminal apparatus 50 is described. A preferable tilt angle of the display apparatus sometimes differs between a case where a register operator or the like performs register work or the like using a POS terminal, and a case where a service engineer or the like performs maintenance work on the POS terminal. In the POS terminal apparatus 50, through suitable selection of a position of the tilt stopper 5, a pivotable angle range of the tilt hinge unit 1 can be changed. Thus, a pivotable angle range of the display unit 51 can be changed. In the following description, a cross section taken along the line A-A of FIG. 33 (also referred to as A-A cross section) is used as appropriate. The A-A cross section is a cross section cut to pass a side surface of the tilt stopper 5.

Figure 34:
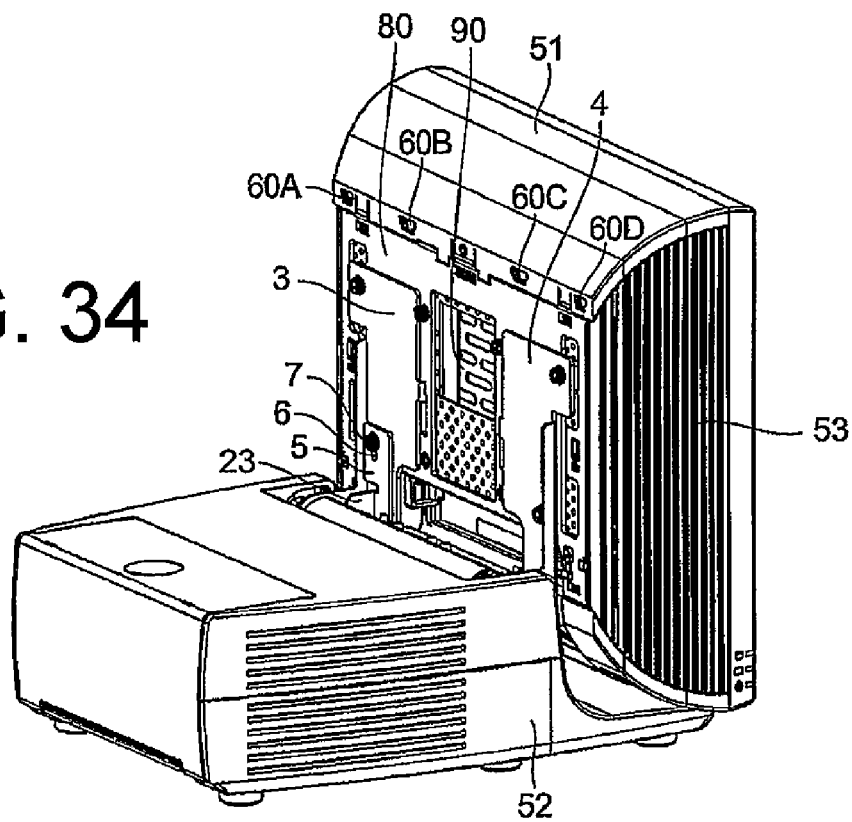
FIG. 34 is a perspective view of the POS terminal apparatus 50 as seen from the rear side thereof when the tilt stopper 5 is fixed at the position P1, the rear cover 55 is removed, and the tilt angle is 0 degrees.
Figure 35:
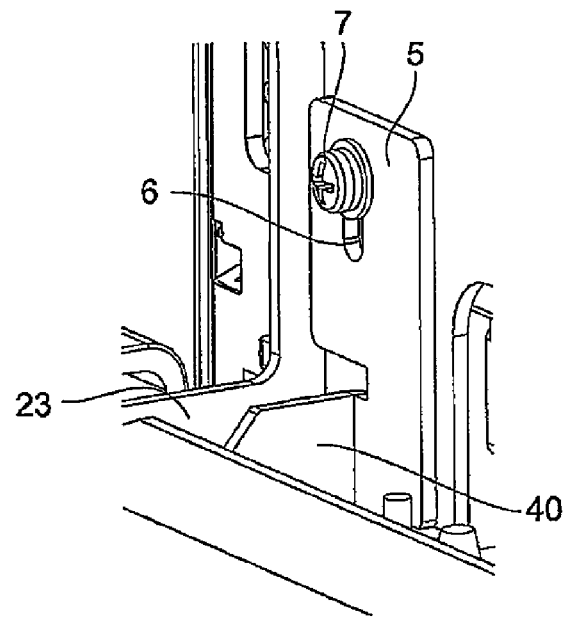
FIG. 35 is an enlarged perspective view of a periphery of the tilt stopper 5 of the POS terminal apparatus 50 in the state illustrated in FIG. 34.

The tilting operation when the tilt stopper 5 is fixed at the position P1 is described. In order to clarify a position of the tilt stopper 5, the rear cover 55 is removed in FIG. 34 and FIG. 35. As illustrated in FIG. 35, the fixing screw 7 is fixed so as to abut against the upper end of the through hole 6.

Figure 36:
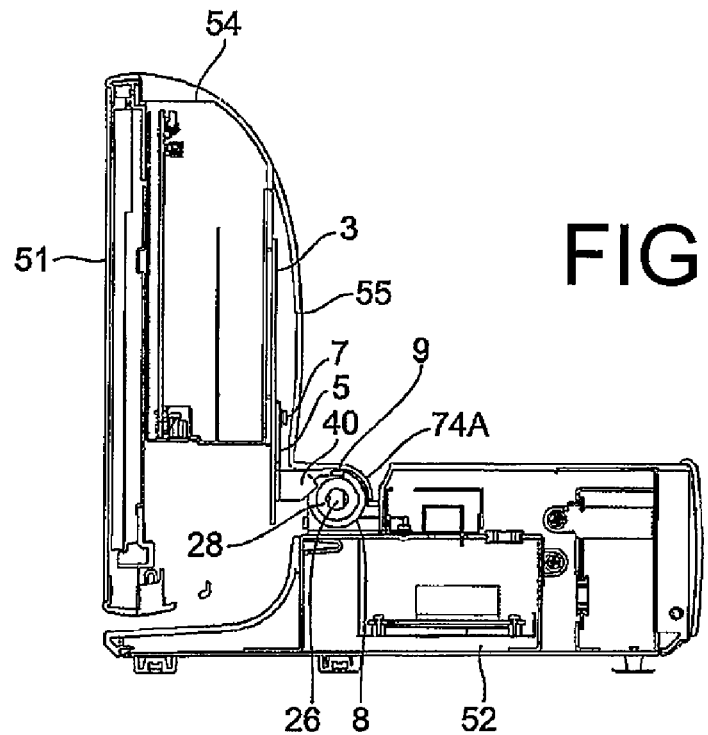
FIG. 36 is a sectional view of the POS terminal apparatus 50 taken along the line A-A of FIG. 33 when the tilt stopper 5 is fixed at the position P1, the rear cover 55 is mounted, and the tilt angle is 0 degrees.
Figure 37:
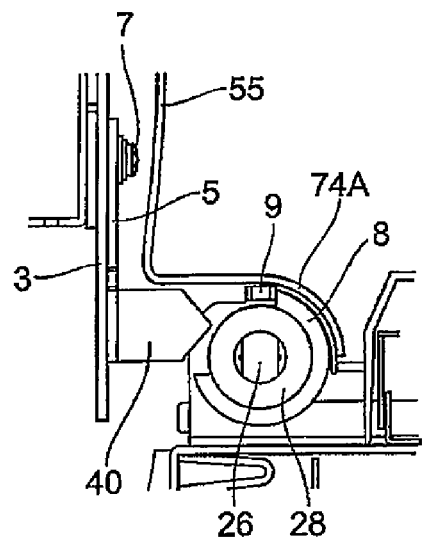
FIG. 37 is an enlarged view for illustrating the tilt stopper 5 and a periphery of a coupling region in the sectional view of FIG. 36.

The A-A cross section of the POS terminal apparatus 50 at this time is illustrated in FIG. 36 and FIG. 37. The line A-A is an imaginary line introduced for description. The rear cover 55 is in a mounted state. The rear cover 55 is not held in contact with the stopper piece 40. Further, the coupling region cover 74A covers the protrusion 9, the cutout disc 8, and the like from a position which is not excessively apart from the protrusion 9, the cutout disc 8, and the like.

Figure 38:
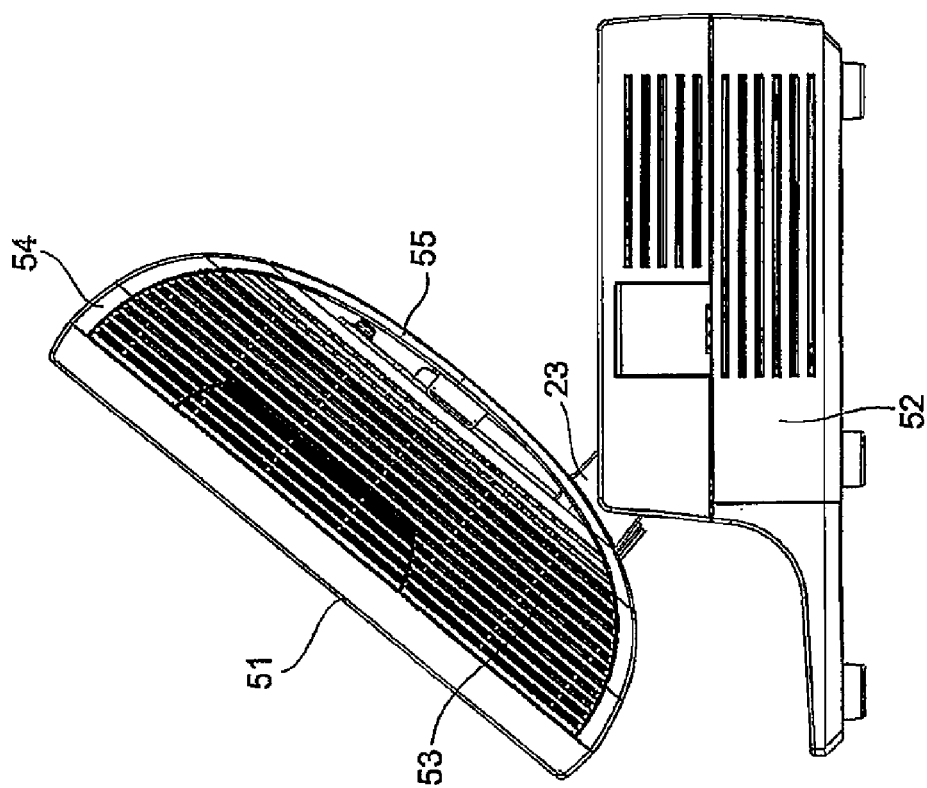
FIG. 38 is a side view of the POS terminal apparatus 50 when the tilt stopper 5 is fixed at the position P1, the rear cover 55 is mounted, and the tilt angle is 40 degrees.
Figure 39:
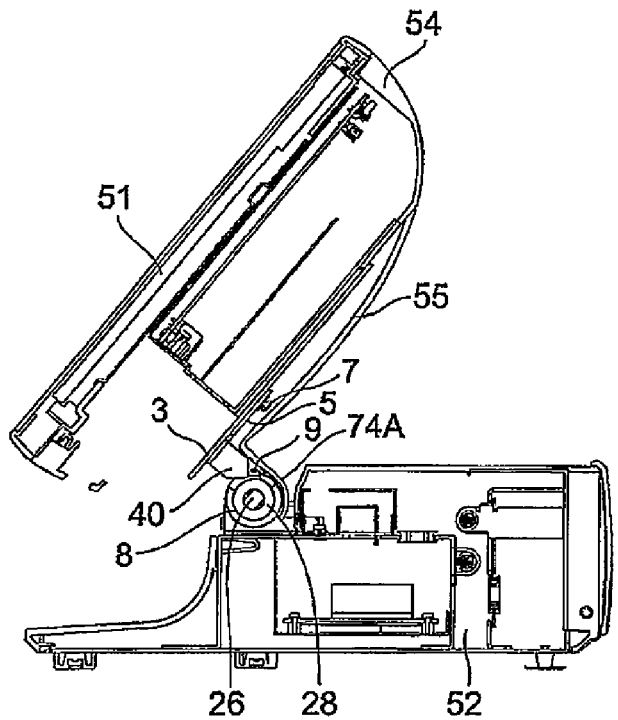
FIG. 39 is a sectional view of the POS terminal apparatus 50 taken along the line A-A of FIG. 33 when the tilt stopper 5 is fixed at the position P1, the rear cover 55 is mounted, and the tilt angle is 40 degrees.
Figure 40:
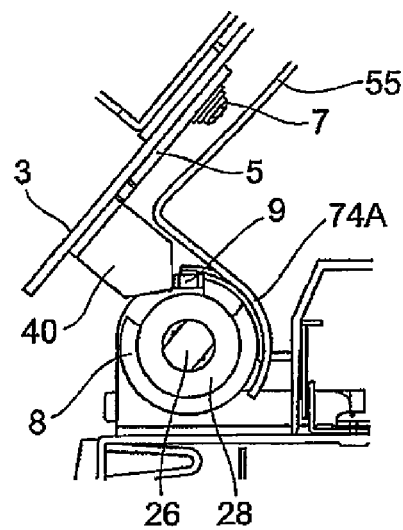
FIG. 40 is an enlarged view for illustrating the tilt stopper 5 and the periphery of the coupling region in the sectional view of FIG. 39.

FIG. 38 is an illustration of a state in which the display unit 51 tilts from the state illustrated in FIG. 36 or FIG. 37. Further, the A-A cross section at this time is illustrated in FIG. 39 and FIG. 40. The pivoting angle is limited similarly to the case described in Embodiment 1 with reference to FIG. 11 and FIG. 12. That is, it can be understood that, before the cutout disc 8 and the protrusion 9 limit the pivoting angle, the stopper piece of the tilt stopper 5 and the protrusion 9 are brought into contact with each other, thereby setting the upper limit of the pivotable angle to the second upper limit angle (40 degrees). At this time, the pivotable angle is in a range of from the lower limit (0 degrees) defined by the cutout disc 8 and the protrusion 9, to the second upper limit angle (40 degrees) defined by the stopper piece 40 and the protrusion 9.

In general, an operator performs various operations of the POS terminal while standing up. Accordingly, the operator performs the operations while looking down the display unit 51 in an obliquely downward direction. As a matter of convenience, it is preferred that the tilt angle of the display unit 51 be set to such an angle that the operator faces a screen of the display unit 51 with a line of sight directed straight toward the screen. When the tilt angle of the display unit 51 is extremely large (for example, 90 degrees), the screen becomes less visible instead. When the display unit 51 tilts under a state in which the tilt stopper 5 is fixed at the position P1, the display unit 51 does not tilt at an angle larger than the second upper limit angle. Therefore, an operation environment for the operator can be kept suitable.

Figure 41:
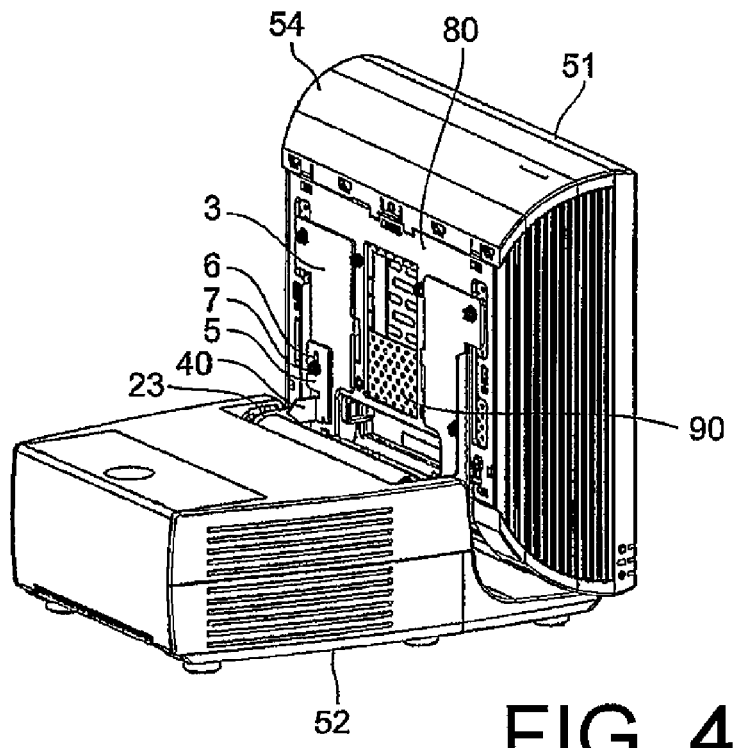
FIG. 41 is a perspective view of the POS terminal apparatus 50 as seen from the rear side thereof when the tilt stopper 5 is fixed at the position P2, the rear cover 55 is removed, and the tilt angle is 0 degrees.
Figure 42:
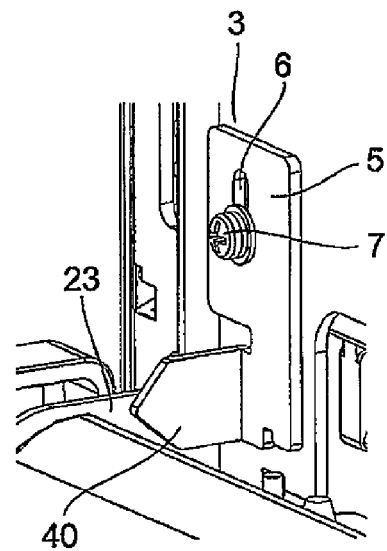
FIG. 42 is an enlarged view for illustrating the tilt stopper 5 and the periphery of the coupling region in the sectional view of FIG. 41.

Next, the tilting operation when the tilt stopper 5 is fixed at the position P2 is described. FIG. 41 and FIG. 42 are illustrations of a state after the rear cover 55 is removed and the tilt stopper 5 is shifted from the position P1 to the position P2. As is apparent particularly from FIG. 42, the fixing screw 7 is fixed so as to abut against the lower end of the through hole 6.

Figure 43:
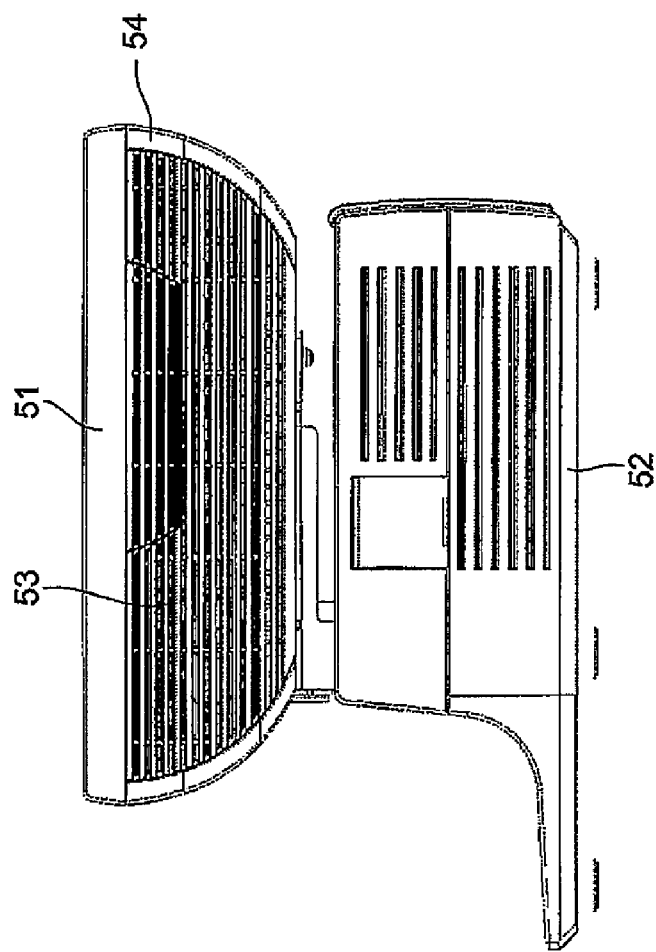
FIG. 43 is a side view of the POS terminal apparatus 50 when the tilt stopper 5 is fixed at the position P2, the rear cover 55 is removed, and the tilt angle is 90 degrees.
Figure 44:
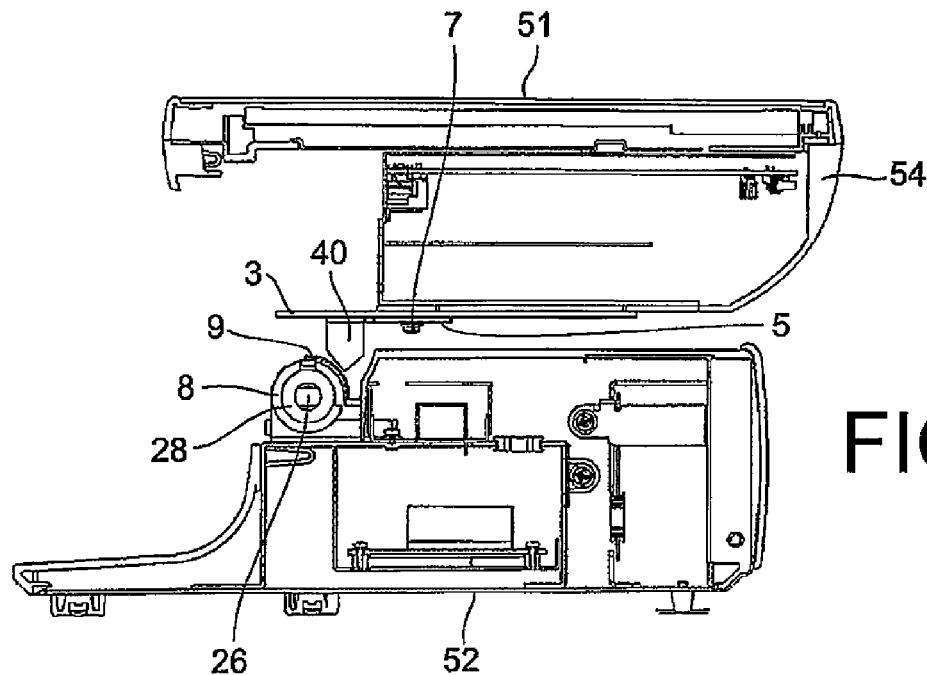
FIG. 44 is a sectional view of the POS terminal apparatus 50 taken along the line A-A of FIG. 33 when the tilt stopper 5 is fixed at the position P2, the rear cover 55 is removed, and the tilt angle is 90 degrees.
Figure 45:
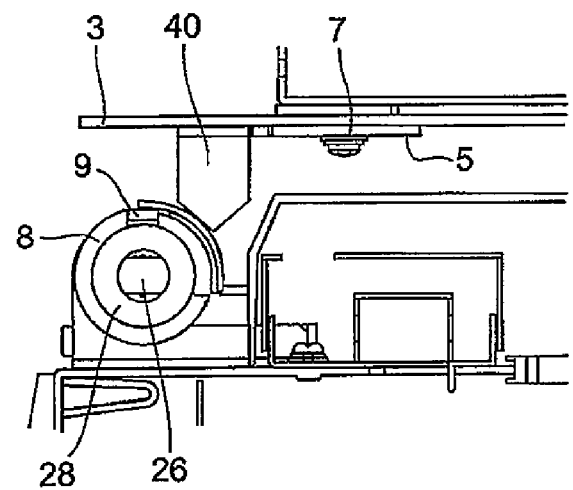
FIG. 45 is an enlarged view for illustrating the tilt stopper 5 and the periphery of the coupling region in the sectional view of FIG. 44.

At this time, as in the case described in Embodiment 1 with reference to FIG. 15 and FIG. 16, the tilt hinge unit 1 is pivoted up to 90 degrees being the first upper limit angle. Accordingly, as illustrated in FIG. 43, the display unit 51 can be completely laid down. The A-A cross section of the POS terminal apparatus 50 at this time is illustrated in FIG. 44 and FIG. 45.

It is sometimes preferred that the screen of the display tilt up to 90 degrees, for example, when a service engineer performs maintenance work on the POS terminal. In such a case, it is only necessary to first remove the rear cover 55 from the POS terminal apparatus 50, and to shift the tilt stopper 5 from the position P1 to the position P2 after loosening the fixing screw 7. At this time, it is not necessary to remove the tilt stopper 5 and the fixing screw 7. Accordingly, there is no risk of loss of the tilt stopper 5 and the fixing screw 7 during a process of changing the pivotable angle range.

Before the POS terminal apparatus 50 is returned to an operator or the like after completion of desired maintenance work, a worker needs to return the tilt stopper 5 to the position P1, but a worker may forget to return the tilt stopper 5. However, in the POS terminal apparatus 50, forgetting to return the tilt stopper 5 is prevented in the following manner.

Figure 46:
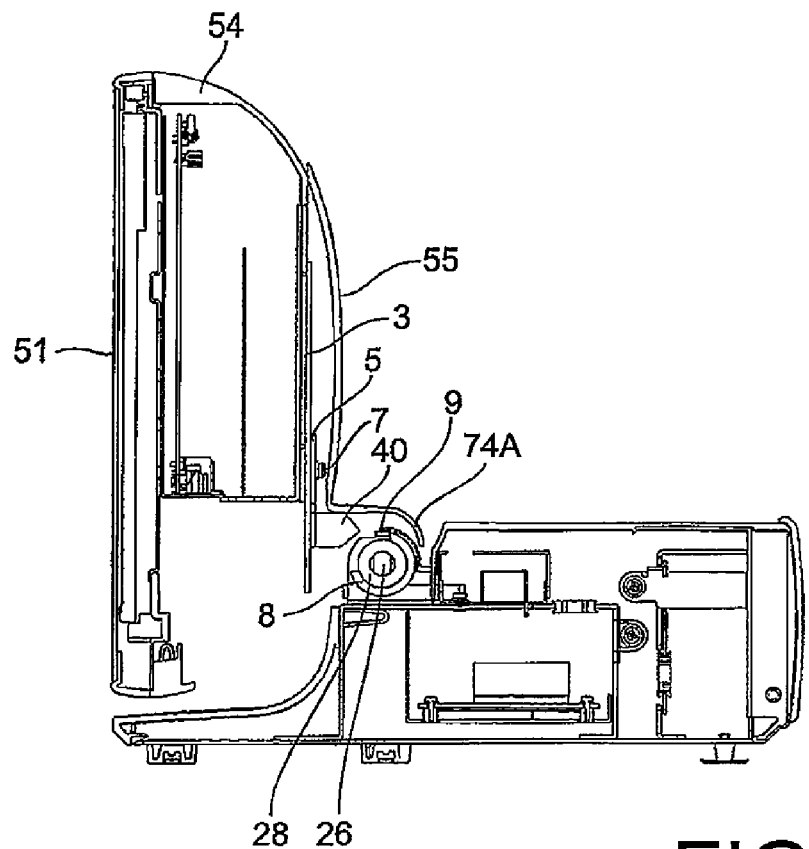
FIG. 46 is a sectional view of the POS terminal apparatus 50 taken along the line A-A of FIG. 33 under a state in which mounting of the rear cover 55 is intended when the tilt stopper 5 is fixed at the position P2 and the tilt angle is 90 degrees.
Figure 47:
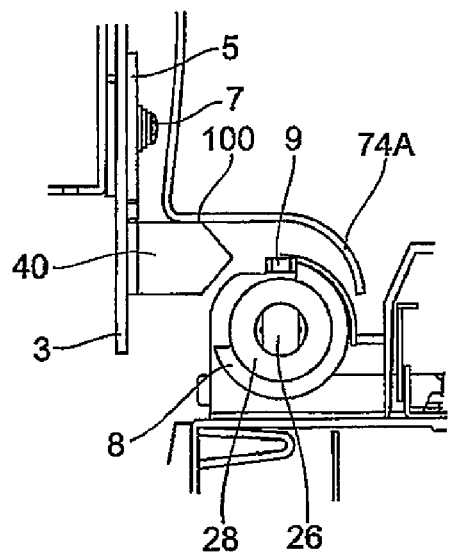
FIG. 47 is an enlarged view for illustrating the tilt stopper 5 and the periphery of the coupling region in the sectional view of FIG. 46.
Figure 48:
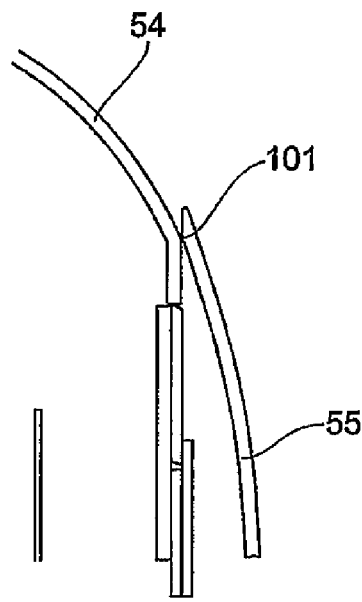
FIG. 48 is an enlarged view for illustrating an upper portion and a periphery of the rear cover 55 in the sectional view of FIG. 46.

After the maintenance work, when mounting of the rear cover 55 is intended under a state in which the tilt stopper 5 is at the position P2, the tilt hinge unit 1 is brought into the state illustrated in FIG. 46 to FIG. 48.

That is, as illustrated in FIG. 47, the stopper piece 40, which is shifted to a position upper than the position P1, and the coupling region cover 74A are brought into contact with each other so that a pushed-up region 100 is formed between the stopper piece 40 and the coupling region cover 74A. As a result, the rear cover 55 cannot be set at a predetermined position. Further, as illustrated in FIG. 48, a misregistration 101 is seen at an upper portion of the rear cover 55. Thus, it can be easily confirmed visually that the rear cover 55 is not mounted at the predetermined position. In addition, based on the fact that the engagement protrusions 70A to 70D, the engagement protrusions 73A and 73B, and the projection protruding portions 72A and 72B of the rear cover 55 are not engaged with or fitted into the corresponding engagement holes and the like, a worker notices that the rear cover 55 is not mounted properly. The fact that the click feeling to be generated when the projection protruding portions 72A and 72B are fitted into the fitting holes 81A and 81B is not generated may allow the worker to notice that the rear cover 55 is not mounted properly. Based on those facts, the worker notices that the rear cover 55 cannot be mounted properly. As a cause of the fact that the rear cover 55 cannot be mounted properly, the worker may notice that the stopper piece 40 is shifted to the position upper than the position P1, that is, the tilt stopper 5 remains at the position P2. As a result, the POS terminal apparatus 50 in a state of having incorrect setting of the tilt angle range can be prevented from being delivered to an operator.

This invention is described above based on the embodiments. However, this invention is not limited to the embodiments.

For example, in Embodiments 1 and 2, the lower limit of the tilt angle is set to 0 degrees, and the first upper limit angle is set to 90 degrees. However, it may be apparent for a person skilled in the art that those limits of the tilt angle can be easily changed by changing the shape of the cutout disc 8.

Figure 49:
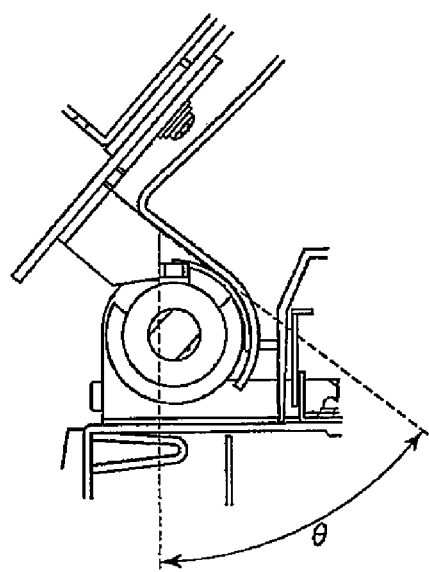
FIG. 49 is a sectional view taken along the line A-A of FIG. 33, for illustrating a modification of the tilt stopper 5.

Further, the second upper limit angle is set to 40 degrees. However, it may be apparent for a person skilled in the art that the second upper limit angle can be changed by changing the shape of the tilt stopper 5, in particular, an angle θ formed by the distal end of the stopper piece 40 and the coupling region cover 74A or 74B as illustrated in FIG. 49.

Further, in the POS terminal apparatus 50, the top cover 54 and the rear cover 55 are separately provided as covers configured to cover the back surface of the display unit 51. However, the top cover 54 and the rear cover 55 may be integrated into a single cover.

Further, in Embodiment 2, the LCD and the control unit are arranged in the display unit, and the power source apparatus is arranged in the base unit. However, the LCD may be arranged in the display unit, and the control unit and the power source apparatus may be arranged in the base unit.

Further, in the above-mentioned embodiments, the protrusion 9 plays both a role of preventing pivoting of the tilt stopper 5, and a role of preventing pivoting of the cutout disc 8. The protrusion 9 plays the two roles in this manner, thereby achieving reduction of the number of components of the tilt hinge unit 1, and simplification of the configuration. However, this invention is not limited thereto, and separate protrusions may be formed on the tilt stopper 5 and the cutout disc 8, respectively.

This application is based on and claims the benefit of priority from Japanese Patent Application No. 2015-085795, filed on Apr. 20, 2015, the disclosure of which is incorporated herein by reference in its entirety.

REFERENCE SIGNS LIST 1 hinge unit
2 first member
3, 4 second member
5 tilt stopper
6, 25 through hole
7 fixing screw
8 cutout disc
9 protrusion
21, 23 support portion
22 bearing hole
24 shaft fixing hole
26 bolt
27, 31 washer
28 spacer
29 belleville spring
30 nut
40 stopper piece
50 POS terminal apparatus
51 display unit
52 base unit
53 side cover
54 top cover
55 rear cover
60A to 60D, 82A, 82B, 85A to 85C engagement hole
61A to 61C engagement claw
62A, 62B first positioning protrusion
63A to 63D second positioning protrusion
64A, 64B, 64C, 70A to 70D, 73A, 73B engagement protrusion
71A, 71B projection
72A, 72B projection protruding portion
74A, 74B coupling region cover
80 outer frame
81A, 81B fitting hole
83 fixing screw through hole
84A to 84C engagement recess
90 inner frame
91 screw hole
100 pushed-up region formed by stopper piece 40
101 misregistration

The invention claimed is:

1. A display apparatus, comprising: a hinge unit, comprising: a first member; a second member;
    a coupling member configured to couple the first member and the second member to each other in a pivotable manner;
    a first stopper member fixed to the first member; and a first limiting member capable of being fixed to at least two positions of the second member, the first limiting member being configured to limit a mutually pivotable angle between the first member and the second member within a first angle range in such a manner that the first limiting member is brought into contact with the first stopper member when the first limiting member is fixed at a first position of the second member, and being held in non-contact with the first stopper member irrespective of a pivoting angle when the first limiting member is fixed at a second position of the second member,
    a first casing fixed to the first member, and a second casing fixed to the second member,
    wherein the second casing comprises a cover which is removable, and
    wherein the first stopper member prevents mounting of the cover when the first stopper member is at the second position.

2. A display apparatus according to claim 1, the hinge unit further comprising:
    a second stopper member fixed to the first member; and
    a second limiting member configured to limit a pivotable angle of the second member with respect to the first member within a second angle range different from the first angle range in such a manner that the second limiting member is brought into contact with the second stopper member.

3. A display apparatus according to claim 2, wherein the first limiting member has a through hole and has an elongated opening, wherein the hinge unit further comprises a fixing tool that is passed through the through hole and is configured to fix the first limiting member to the second member, and
    wherein the fixing tool fixes the first limiting member at any positions including the first position and the second position of the second member in accordance with a position of the through hole through which the fixing tool is passed.

4. A display apparatus according to claim 2,
    wherein the second limiting member comprises a member that is fixed to the second member and has a shape obtained by cutting out a part of a disc, and
    wherein the second stopper member is arranged in the cut-out part of the disc.

5. A display apparatus according to claim 4,
    wherein the first limiting member has a through hole and has an elongated opening,
    wherein the hinge unit further comprises a fixing tool that is passed through the through hole and is configured to fix the first limiting member to the second member, and
    wherein the fixing tool fixes the first limiting member at any positions including the first position and the second position of the second member in accordance with a position of the through hole through which the fixing tool is passed.

6. A display apparatus according to claim 1, the hinge unit further comprising a a second limiting member configured to limit a pivotable angle of the second member with respect to the first member within a second angle range different from the first angle range in a such a manner that the second limiting member is brought into contact with the first stopper member.

7. A display apparatus according to claim 6, wherein the first limiting member has a through hole and has an elongated opening, wherein the hinge unit further comprises a fixing tool that is passed through the through hole and is configured to fix the first limiting member to the second member, and wherein the fixing tool fixes the first limiting member at any positions including the first position and the second position of the second member in accordance with a position of the through hole through which the fixing tool is passed.

8. A display apparatus according to claim 1, wherein the first limiting member has a through hole and has an elongated opening, wherein the hinge unit further comprises a fixing tool that is passed through the through hole and is configured to fix the first limiting member to the second member, and wherein the fixing tool fixes the first limiting member at any positions including the first position and the second position of the second member in accordance with a position of the through hole through which the fixing tool is passed.

9. A method of limiting a pivoting angle of a hinge unit of a display apparatus, the hinge unit comprising a first member, a second member, and a coupling member configured to couple the first member and the second member to each other in a pivotable manner, the display apparatus comprising the hinge unit, a first casing and a second casing, the first member being fixed to the first casing, the second member being fixed to the second casing, the method comprising:

limiting a mutually pivotable angle between the first member and the second member within a first angle range in such a manner that a first limiting member and a first stopper member fixed to the first member are brought into contact with each other when the first limiting member is fixed at a first position of the second member; and holding the first limiting member and the first stopper member in non-contact with each other irrespective of a pivoting angle when the first limiting member is fixed at a second position of the second member different from the first position, and imposing, by the first limiting member, no limitation on a pivotable angle of the second member with respect to the first member, wherein the first limiting member has a through hole and has an elongated opening, wherein the hinge unit further comprises a fixing tool that is passed through the through hole and is configured to fix the first limiting member to the second member, and wherein the fixing tool fixes the first limiting member at any positions including the first position and the second position of the second member in accordance with a position of the through hole through which the fixing tool is passed.

* * * * *

UNITED STATES PATENT AND TRADEMARK OFFICE
CERTIFICATE OF CORRECTION

PATENT NO. : 10,294,984 B2  
APPLICATION NO. : 15/565470  
DATED : May 21, 2019  
INVENTOR(S) : Shinichirou Yonemaru Page 1 of 1

It is certified that error appears in the above-identified patent and that said Letters Patent is hereby corrected as shown below:

In the Claims

Column 14, Line 2; In Claim 1, after "comprising:", insert --¶--

Column 14, Lines 2-3; In Claim 1, after "comprising:", insert --¶--

Column 14, Line 3; In Claim 1, after "member;", insert --¶--

Column 14, Line 7; In Claim 1, after "and", insert --¶--

Column 14, Line 65; In Claim 6, delete "a a" and insert --a-- therefor

Column 15, Line 1; In Claim 6, after "in", delete "a"

Signed and Sealed this  
Twenty-seventh Day of August, 2019

Andrei Iancu  
*Director of the United States Patent and Trademark Office*